(12) United States Patent
Itoh

(10) Patent No.: US 9,196,635 B2
(45) Date of Patent: Nov. 24, 2015

(54) CIRCUIT BOARD AND DISPLAY DEVICE

(71) Applicant: Sharp Kabushiki Kaisha, Osaka (JP)

(72) Inventor: Ryohki Itoh, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/402,601

(22) PCT Filed: Apr. 24, 2013

(86) PCT No.: PCT/JP2013/062012
§ 371 (c)(1),
(2) Date: Nov. 20, 2014

(87) PCT Pub. No.: WO2013/175926
PCT Pub. Date: Nov. 28, 2013

(65) Prior Publication Data
US 2015/0129866 A1    May 14, 2015

(30) Foreign Application Priority Data

May 24, 2012   (JP) ................................. 2012-119065

(51) Int. Cl.
*H01L 29/10* (2006.01)
*H01L 27/12* (2006.01)
*G02F 1/1362* (2006.01)

(52) U.S. Cl.
CPC ........ *H01L 27/124* (2013.01); *G02F 1/136259* (2013.01); *H01L 27/1225* (2013.01); *H01L 27/1255* (2013.01)

(58) Field of Classification Search
CPC ..................... H01L 29/7869; H01L 29/66969; H01L 27/1259; H01L 27/1225; H01L 27/124; H01L 27/3246; H01L 27/3262; H01L 27/3265; H01L 27/3276; H01L 21/02565; H01L 27/1222; H01L 27/1244; H01L 27/3272
USPC ................ 257/43, 57, 59, E29.068, E21.461; 438/30, 34, 104, 154
See application file for complete search history.

(56) References Cited

U.S. PATENT DOCUMENTS

| 5,086,347 A | 2/1992 | Ukai et al. |
| 5,995,178 A | 11/1999 | Fujikawa et al. |
| 6,249,011 B1 | 6/2001 | Matsumoto |

(Continued)

FOREIGN PATENT DOCUMENTS

| JP | H2-157828 A | 6/1990 |
| JP | H5-265045 A | 10/1993 |

(Continued)

*Primary Examiner* — Mark A Laurenzi
(74) *Attorney, Agent, or Firm* — Chen Yoshimura LLP

(57) ABSTRACT

A circuit board includes: a plurality of first wires and a plurality of second wires intersecting with the first wires; a thin-film transistor element; a plurality of pixel electrodes electrically connected to the drain electrodes of the thin-film transistor element; and a patterned film. In a planar view of the principal surface of the circuit board, two of the plurality of first wires extend parallel to each other between pixels, and the patterned film has a linear portion extending along the first wires between the mutually extending two first wires, wherein the pattern film is provided in the same layer as the second wiring lines.

11 Claims, 19 Drawing Sheets

(56) References Cited

U.S. PATENT DOCUMENTS

| | | |
|---|---|---|
| 2004/0016925 A1 | 1/2004 | Watamura |
| 2005/0285989 A1 | 12/2005 | Sakurai et al. |
| 2010/0294541 A1 | 11/2010 | Funahashi et al. |
| 2011/0180794 A1* | 7/2011 | Yamazaki ................ 257/43 |
| 2012/0062813 A1* | 3/2012 | Koyama ................ 349/43 |
| 2012/0064650 A1 | 3/2012 | Yamazaki et al. |

FOREIGN PATENT DOCUMENTS

| | | |
|---|---|---|
| JP | H9-113930 A | 5/1997 |
| JP | 2000-250436 A | 9/2000 |
| JP | 2004-054069 A | 2/2004 |
| JP | 2006-11162 A | 1/2006 |
| JP | 2010-271610 A | 12/2010 |
| JP | 2012-84866 A | 4/2012 |

* cited by examiner

1028

CIRCUIT BOARD AND DISPLAY DEVICE

TECHNICAL FIELD

The present invention relates to a circuit substrate and a display device. More specifically, the present invention relates to a circuit substrate and a display device that can be suitably used as components of a display device having a dual-gate structure, for example.

BACKGROUND ART

Circuit substrates, particularly active matrix substrates, are widely used in active matrix display devices such as EL (electroluminescence) display devices. Circuit substrates used in conventional liquid crystal display devices had TFT (thin film transistor) elements at respective intersections of a plurality of scan signal lines disposed so as to intersect with a plurality of data signal lines. Image signals are sent as appropriate to respective pixels (electrodes) that are connected to TFT elements due to the switching function of the TFT elements. Furthermore, there are circuit substrates having storage capacitance elements for respective pixels in order to prevent degradation of image signals due to electric discharge or OFF current of the TFT elements while the TFT elements are OFF, and also to use as a path or the like for applying various modulated signals during liquid crystal driving.

Below is an example of a conventional structure of a circuit substrate. Disclosed is a display device provided with an island shaped gate disconnection repairing conductive layer used for repairing disconnections, which includes: a plurality of gate wiring lines provided on a substrate; a first insulating layer provided on the gate wiring lines; a plurality of source wiring lines disposed so as to intersect with the gate wiring lines with the first insulating layer therebetween; an island shaped gate disconnection repairing conductive layer used to repair disconnections in the gate wiring lines disposed over the gate wiring lines with the first insulating layer therebetween; switching elements provided at the intersections of the gate wiring lines and the source wiring lines; a second insulating layer provided over the source wiring lines, the gate disconnection repairing conductive layer, and the switching elements; a contact hole provided in a portion of the second insulating layer; and pixel electrodes connected to the switching elements through the contact holes (see Patent Document 1, for example).

As a thin film transistor array by which it is possible to repair disconnections in a similar manner, a thin film transistor is disclosed, including: a plurality of scan signal lines formed of a first conductive film on a transparent insulating substrate; a plurality of signal lines formed of a second conductive film; pixel electrodes formed on a gate insulating film in an area surrounded by adjacent scan signal lines and adjacent signal lines; thin film transistors connected to the pixel electrodes; and a light-shielding film that is formed of the first conductive film and that forms a light-shielding overlapping portion through surrounding portions of the respective pixel electrodes and the gate insulating film, the surrounding portion facing the signal lines, wherein the light-shielding film has a prescribed area located near both edges thereof along the signal line, the area protruding towards so as to form an overlapping portion for repairing through the signal lines and the gate insulating film (see Patent Document 2, for example).

Furthermore, liquid crystal display devices that can electrically connect disconnected wiring lines or that can improve the yield of the connection is improved by electrically connecting the disconnected wiring lines and making the connection of the circuits and the panel terminal electrodes easy (see Patent Documents 3 to 5, for example.)

RELATED ART DOCUMENTS

Patent Documents

Patent Document 1: Japanese Patent Application Laid-Open Publication No. 2004-054069
Patent Document 2: Japanese Patent Application Laid-Open Publication No. 2000-250436
Patent Document 3: Japanese Patent Application Laid-Open Publication No. H2-157828
Patent Document 4: Japanese Patent Application Laid-Open Publication No. H9-113930
Patent Document 5: Japanese Patent Application Laid-Open Publication No. H5-265045

SUMMARY OF THE INVENTION

Problems to be Solved by the Invention

Patent Document 1 discloses that disconnection can be repaired by disposing a repair wiring line (disconnection repairing conductive layer) on a scan signal line with an insulating layer therebetween. Patent Document 1 discloses a configuration in which a repair wiring line can be disposed anywhere on a scan signal line (gate wiring line, gate), source wiring line (source), and an auxiliary capacitance (Cs) and perform repair.

However, because in the invention disclosed in Patent Document 1, a repair wiring line is disposed over a scan signal line, even if repair is not performed, the capacitance of the scan signal line increases, the signal rounding increases, and power consumption increases. Therefore, there was room for improvement in terms of the difficulty in appropriately driving small display devices that require low power consumption, large display devices that have a low charging rate for each pixel, in devices with high resolution, or the like.

Furthermore, the pixels that are repaired have greater capacitance between adjacent scan signal lines and pixel electrodes, and thus a difference emerges in parasitic capacitance between normal pixels where repair has not been performed and pixels where repair has been performed. There is also a disadvantage that if the capacitance between the scan signal lines and the pixel electrodes becomes larger, a variation in stored potential occurs, causing a variation in luminance during halftone display leading to a decrease in display quality.

In other words, the capacitance increases, rounding takes place, and power consumption increases for pixels such as those shown in FIG. 1 of Patent Document 1 even before repair takes place. Furthermore, in the structure (repaired portion) such as those shown in FIG. 2 of Patent Document 1, the pixel capacitance also changes and a decrease in display quality occurs.

In this manner, in a conventional circuit substrate, if a scan signal line is repaired using a repair wiring line when disconnection occurs, then the subpixel where the repair took place becomes easier to perceive than the rest of the display during halftone display. Furthermore, as the capacitance increases even without repair, the signal rounding becomes greater, causing insufficient charging of each pixel (decrease in voltage applied to liquid crystal), and unevenness in halftone display becomes easier to perceive, especially in low temperature. Furthermore, as the rounding becomes greater, varied color tones can be perceived in both edges of large/high resolution devices.

Furthermore, as repair wiring lines are disposed on a gate insulating film, at the portions of the pixels in which repair was performed, the scan signal line and the repair wiring line in which the same signal is inputted comes closer to the pixel electrode. Therefore, the capacitance between the scan signal line and the pixel electrode increases. Thus, during halftone display, a change in luminance can be seen at the pixel electrode at the repaired portion caused by a load (capacitance) due to difference in potential during writing. Furthermore, even if the capacitances of the respective scan signal lines are compared, only the scan signal line in which repair was performed has a different capacitance from others, and thus a change in luminance can easily take place for one line due to signal rounding.

Furthermore, there is a risk that the display quality decreases in a non-transmissive region of the display region where wiring lines are not disposed, because pin holes are being formed in the light-shielding film such as an active matrix due to defects. The patent document mentioned above has room for improvement in suppressing signal rounding resulting from capacitance increase and in decreasing pin holes.

The present invention takes into consideration the above-mentioned situation, and an object thereof is to provide a circuit substrate and a display device having a patterned film that can sufficiently reduce the capacitance increase, sufficiently suppress a decrease in display quality due to signal rounding, and sufficiently block light at a portion where a light-shielding member is damaged.

Means for Solving the Problems

The inventor of the present invention conducted research on a circuit substrate and a display device in which a capacitance increase is reduced, a decrease in display quality due to signal rounding is sufficiently suppressed, and an occurrence of a transparent portion due to a damage of the light-shielding member is reduced, and focused on providing a patterned film between two wiring lines in a circuit substrate having two wiring lines between pixels. The inventor of the present invention found that by providing a patterned film between two wiring lines disposed between pixels, the decrease in aperture ratio is sufficiently suppressed, the increase in capacitance is sufficiently reduced, and the occurrence of the transparent portion due to the damage of the light-shielding member is sufficiently reduced. It was found that the pixel defects can be suitably repaired.

Furthermore, as disclosed in the respective patent documents above, if a repair wiring line is used as a countermeasure to disconnections of scan signal lines, if the repair wiring lines are disposed on the scan signal lines with an insulating layer therebetween, then the capacitance increases, and signal rounding can easily occur. On the other hand, if the repair wiring line is disposed so as to not overlap the scan signal line to not increase the capacitance, then the aperture ratio decreases. In this situation, the inventor of the present invention found that a display device that has excellent quality after repair can be formed by providing a plurality of projections on at least one side of the patterned film, the plurality of projections having overlapping portions with the first wiring line, and at least one of the overlapping portions has a wiring line structure in which an insulating film is between the overlapping portion and the first wiring line. This way, the projections can function as a repair wiring line and significantly reduce the capacitance change in the pixel electrode of the repaired portion. Furthermore, it was found that a similar effect can be achieved by providing a plurality of projections in the first wiring line instead of a patterned film. Because there is no repair wiring line that overlaps a wide area of the scan signal line, the power consumption is small, and the present invention is advantageous for use in small devices requiring low power consumption. Specifically, it was found that the effect on the capacitance on scan signal lines is small and decrease in display quality resulting from signal rounding and capacitance change does not occur due to a circuit substrate having a dual gate structure or the like with two wiring lines between adjacent pixels being provided with a repair wiring line (without melt connection portion) disposed between adjacent wiring lines (scan signal lines, for example). Furthermore, as mentioned above, the present invention was conceived when the present inventor found that the problem above can be solved as the portion between adjacent scan signal lines does not affect the aperture ratio, and thus, the problem of the aperture ratio does not occur.

As for the problem of signal rounding, in the conventional structure, it was evaluated that a signal rounding exists before and after repair. On the other hand, the present invention is acknowledged for having almost no signal rounding before and after repair. However, because only the projection for laser correction overlaps the scan signal line, there is a risk that signal rounding will occur more in the present invention than in a structure without a repair wiring line. Furthermore, because the main portion thereof (not the projection, but the line-shaped portions along two wiring lines adjacent to each other) is usually disposed so as to be separated by several micrometers from the adjacent two wiring lines, the effect of signal rounding is negligible compared to a structure in which repair wiring lines are disposed on the scan signal lines.

In this manner, the difference between the present invention and conventional technology is that, in a dual gate structure, a patterned film is disposed (without a melt connecting portion) between adjacent scan signal lines, for example. In this type of structure, the effect to the capacitance of scan signal lines is small, and thus signal rounding and a decrease in display quality due to change in capacitance do not occur. In other words, this structure is different from that disclosed in Patent Document 1 in which the repair wiring line overlaps a large area of the signal line, for example, and thus, adverse effects caused by an increase in the parasitic capacitance can be suppressed. The area between adjacent scan signal lines does not affect the aperture ratio, and therefore, there are no disadvantages regarding the aperture ratio decreasing. The patterned film with this type of effect can be used as a repair wiring line by having the patterned film at least include a plurality of projections on one side thereof, the plurality of projections having an overlapping portion that overlaps the first wiring line, at least one overlapping portion overlapping via an insulating film.

If a repair wiring line is disposed so as to overlap a large area of a scan signal line or the like, then in a normal state, the signal rounding in the signal line increases, thus causing a decrease in charging rate, a difference in quality towards the edge of the display, and in particular, the difference in signal rounding can be obvious for a two layer wiring line structure that selectively uses two types of wiring lines as lead-out lines (wiring lines to connect to drivers) of scan signal lines. In this case, there are disadvantages such as a stripe-shaped display anomaly being perceived, but these types of problems do not occur in the present invention.

Recently, the dual-gate structure is often adopted in mid-sized devices to lower the cost. The number of scan signal lines increase in a dual-gate structure and thus there is demand to narrow the scan signal lines. However, this increases instances of disconnection. If a repair wiring line is disposed at a normal location such as the location disclosed in Patent Document 1, then because the repair wiring line overlaps a wide area of the signal line, the capacitance increases, causing greater signal rounding that leads to adverse effects on the display quality and an increase in power consumption. These disadvantages are resolved in the present invention.

Usually, in order to avoid leaks between the scan signal lines, the area between two scan signal lines has a gap of a size sufficient to not decrease the yield. This gap is approximately 10 µm, for example. The width of the scan signal line is usually approximately 5 µm. While it is not be a problem even if the probability of disconnection in the repair wiring line is greater than in the scan signal line, if the width of the repair wiring line is 5 µm as in the scan signal line, then the space between the repair wiring line and the scan signal line can be set to be 2.5 µm, and thus, decrease in aperture ratio does not occur.

In the present invention, a circuit substrate included in a display device that displays an image by using pixels includes: a substrate; a plurality of first wiring lines and a plurality of second wiring lines that intersect with the first wiring lines on the substrate; thin film transistor elements; a plurality of pixel electrodes on the substrate, the plurality of pixel electrodes being electrically connected to drain electrodes of the thin film transistor elements; and a patterned film on the substrate, wherein two first wiring lines extend alongside each other between two adjacent rows of pixels in a plan view, and the patterned film generally has a linear shape extending along and between the two first wiring lines extending alongside each other. The plurality of first wiring lines are usually provided in the same layer. The same can be said for the plurality of the second wiring lines.

There should be at least two of the plurality of first wiring lines extending between rows of pixels or columns of pixels. The structure may have at least two of the first wiring lines disposed between the row of pixels or the column of pixels for alternating pixel rows or alternating pixel columns and not for other pixel rows or columns, but it is preferable that at least two of the first wiring lines be disposed for each pixel row or each pixel column. It is preferable that the two wiring lines extending alongside each other be substantially parallel to each other. The intersection mentioned above can be substantially perpendicular, for example At least two of the first wiring lines should extend alongside each other between pixels when the main surface of the substrate is seen in a plan view, but it is preferable that two first wiring lines extend alongside each other between pixels. A portion of a wiring line may be branched in order to achieve two wiring lines extending alongside each other between pixels, but it is preferable that two separate wiring lines be disposed adjacent to each other.

A dual-gate structure is one preferable configuration of the present invention. By having a dual-gate structure, the number of gate wiring lines doubles and the number of source wiring lines halves. As a result, the number of gate drivers doubles and the number of source drivers halves. The source drivers are more expensive than the gate drivers, and thus the cost of the drivers as a whole decreases. By applying the present invention to a circuit substrate with a dual-gate structure, the effect of the present invention can be sufficiently achieved in a configuration in which the cost can be reduced by decreasing the number of drivers.

There is a reference document showing a structure in which two source wiring lines are adjacent to each other (Japanese Patent Application Laid-Open Publication No. H10-197894). This structure is used in X ray sensors and the like. The present invention can be applied to a structure in which two wiring lines are adjacent to each other, and can be applied not only to a configuration in which a patterned film is disposed between two scan signal lines, but also to a configuration in which other two wiring lines such as two source wiring lines are disposed between the row of pixels or column of pixels.

In terms of the range of the width (maximum and minimum value) regarding the line-shaped portion of the patterned film, the scan signal line usually is approximately 5 µm in width, but the repair wiring line can be designed to be narrower because it does not affect the quality even if it disconnects. In other words, the repair wiring line can be designed to be 5 µm or less. If the width of the repair wiring line is 8 µm, then the probability of disconnection is extremely low. In this case, if the space between the scan signal lines is 10 µm, then the space between the repair wiring line and the scan signal line is only 1 µm, but the two can still be separated. On the other hand, if the width is less than 3 µm, then the possibility of disconnection increases, and therefore, it is preferable that the maximum width be 8 µm and the minimum be 3 µm.

The circuit substrate of the present invention has a plurality of gate wiring lines and a plurality of data wiring lines provided on the substrate, a thin film transistor in which a gate electrode is connected to a gate wiring line and a source electrode is connected to a source wiring line, and a pixel electrode to which the drain electrode or the drain lead-out wiring line of the thin film transistor is connected. It is preferable that the first wiring line be the gate wiring line and that the second wiring line be the source wiring line, for example.

By the circuit substrate of the present invention having this type of structure, the current (gate signal) flowing in the gate wiring line controls the driving of the thin film transistor and the driving of the pixel electrode can be controlled by the current (data signal) flowing in the data signal line when the thin film transistor is ON.

It is preferable that the circuit substrate further include an insulating film, the patterned film and one of the first wiring lines having a plurality of projections on one side thereof in the widthwise direction of the line-shaped portion, the plurality of projections having the patterned film and having an overlapping portion that overlaps another of the first wiring lines via an insulating film. The first wiring line mentioned above should be at least one of the two first wiring lines above. According to the circuit substrate, if a first wiring line disconnects during the manufacturing process of the circuit substrate, the two portions that are separated by the disconnection can be reconnected by forming an alternate route by using the patterned film having projections or by using the first wiring line having projections, and therefore the first wiring line can be repaired. In the present invention, a decrease in aperture ratio can be prevented by disposing a patterned film between two wiring lines provided between pixels. If the circuit substrate of the present invention has a patterned film or a first wiring line having the projections, then the wiring lines can be repaired, and if the circuit substrate is used for a panel substrate of a liquid crystal display device, then the circuit substrate can contribute to improving the yield of the liquid crystal display device.

A gate insulating film, a protective film of a thin film transistor, or the like can be used as the insulating film that insulates the overlapping portion of the wiring line structure. There is no special limitation on the thickness of the insulating film, but in order to electrically connect the overlapping portion of the wiring line structure with ease by laser radiation or the like, it is preferable that the thickness be 5000 Å or less.

It is more preferable that the patterned film have a plurality of projections on both sides in the widthwise direction of the line-shaped portion, and that the plurality of projections have an overlapping portion that overlaps the two first wiring lines via an insulating film. The widthwise direction of the line-shaped portion usually refers to a direction that is not the longer side direction (that is, the shorter side direction). The widthwise direction of the line-shaped portion of the patterned film is usually the same as the widthwise direction of the first wiring line. A portion of the projection of the patterned film is an overlapping portion that overlaps the first wiring line.

It is preferable that the two first wiring lines respectively have a plurality of projections on the patterned film side thereof in the widthwise direction of the line-shaped portion, the plurality of projections having overlapping portions that overlap the patterned film across the insulating film.

As long as the effect of the present invention is preserved, not all of the overlapping portions need to overlap via the insulating film, but it is preferable that all of the plurality of projections that overlap the patterned film or the first wiring line overlap across the insulating film.

It is preferable that one of the first wiring line or the second wiring line be a gate wiring line and that the other one be a source wiring line.

The thin film transistor elements usually has a gate electrode connected to a gate wiring line and a source electrode connected to a data signal line. The circuit substrate is usually also referred to as an active matrix substrate. The members such as a wiring line, a patterned film, a thin film transistor element, an insulating film, and the like are usually disposed on a transparent substrate such as a glass substrate.

It is preferable that the patterned film be provided in the same layer as the second wiring line, for example. With this configuration, it is not necessary to form a new insulating film to form the patterned film, and thus, the circuit substrate of the present invention can be manufactured at ease.

It is preferable that the circuit substrate further include a storage capacitance wiring line, and that the storage capacitance wiring line overlap the projections when seeing the main surface of the substrate in a plan view.

As long as the circuit substrate and the display device of the present invention is configured to have these components, there is no special limitation regarding the circuit substrate and the display device including or not including other components.

It is preferable that the wiring line structure or the connecting electrode for repair be provided in the layer including the signal line (layer including source wiring lines, for example). With this configuration, the wiring line structure or the connecting electrode for repair can easily be formed without adding another step to form a film. In the present invention, a "layer including source wiring lines" refers to the layer in which the source wiring lines are formed in the circuit substrate having a multilayer structure. Usually, when the patterned film and the source wiring line are formed in the same layer, the patterned film and the source wiring line are formed in the same step. It is preferable that the patterned film be formed using the same conductive material as the source wiring line and the thin film transistor element of the source electrode in the same process as the source wiring line and the source electrode.

It is preferable that the storage capacitance wiring line be formed using the same conductive material as the gate wiring line and the gate electrode in the same process as the gate wiring line and the gate electrode. It is also preferable that the storage capacitance electrode be formed using the same conductive material as the source wiring line and the drain lead-out wiring line in the same process as the source wiring line and the drain lead-out wiring line.

It is preferable that the patterned film is formed of a material including at least one of Al, Cr, Ta, Ti, W, Mo, and Cu. With this configuration, the patterned film (repair wiring line) is formed of a material including a high melting point metal before performing melt processing using a laser or the like, but if compared to a transparent conductive film such as ITO or the like, the patterned film and the first wiring line can be electrically connected more easily and reliably.

Next, the respective components of the active matrix substrate of the present invention are described.

The material of the substrate can be a transparent insulating material such as glass or plastic.

The material for the signal lines (gate wiring line, source wiring line), gate electrode, and drain lead-out wiring line can be a metal film, an alloy film, a multilayer film, or the like of titanium (Ti), chromium (Cr), aluminum (Al), molybdenum (Mo), tantalum (Ta), tungsten (W), copper (Cu), or the like. The method of forming the signal lines, the gate electrodes, and the drain lead-out wiring lines includes patterning or the like after photoetching or the like once the film is formed by sputtering the material or the like.

The material for the source electrode and the drain electrode can be an $n^+$ amorphous silicon doped with phosphorus or the like. The source electrode and the drain electrode can be formed by separating the source and the drain through dry etching or the like after the film is formed by plasma CVD using the material mentioned above.

In order to reduce the manufacturing steps and the manufacturing cost, it is preferable that the gate wiring line, the gate electrode, the source wiring line, the drain lead-out wiring line, the source electrode, and the drain electrode respectively be formed using the same material during the same process. There is no special limitation on the thickness of the signal line, the gate electrode and the drain lead-out wiring line, but it is preferable that the minimum is substantially 1000 Å, and that the maximum is substantially 3000 Å. It is preferable that the thickness of the source electrode and the drain electrode be 500 Å.

The material for the pixel electrode can be a transparent conductive material such as ITO, IZO, tin oxide, or zinc oxide. The method of forming the pixel electrode includes pattering or the like after photoetching or the like once the film is formed by sputtering the material or the like. The pixel electrode can have a rectangular shape or the like. There is no special limitation on the thickness of the pixel electrode, but it is preferable that the minimum thereof be substantially 1000 Å and that the maximum thereof be substantially 3000 Å. It is preferable that the pixel electrode and the drain electrode or the drain lead-out wiring line be connected through a contact hole or the like formed in the interlayer insulating film.

A preferable structure of the active matrix substrate of the present invention can include a structure having (1) a substrate, (2) a gate wiring line, a gate electrode, and an auxiliary capacitance wiring line, (3) a (gate) insulating film, (4) a high resistance semiconductor layer, (5) a source wiring line, a source electrode, a drain electrode, a drain lead-out wiring line, and an auxiliary capacitance electrode, (6) an interlayer insulating film (including a contact hole), and (7) a pixel electrode in that order from the bottom layer.

It is preferable that the thin film transistor element of the circuit substrate of the present invention include an oxide semiconductor.

The present invention also includes a display device having the circuit substrate of the present invention. According to the display device of the present invention, during the manufacturing process of the circuit substrate, when a pixel defect occurs, the repair can be performed reliably and with ease, and thus the pixel defect can be sufficiently reduced to obtain high display quality and the manufacturing yield can be increased. A liquid crystal display device of the present invention can be suitably used in large liquid crystal TVs or the like that require point defects in particular to be suppressed from occurring.

The display device of the present invention can be an EL (electroluminescence) display device or the like, but it is preferable that the display device of the present invention be a liquid crystal display device, for example.

The present invention is also a method to repair pixel defects occurring in the pixel substrate of the present invention, the pixel defect repairing method of the circuit substrate also being a method to repair a pixel defect by electrically connecting a disconnected first wiring line through a patterned film.

It is preferable that the electrically connecting process above be performed by at least two areas where the patterned film and the first wiring line overlap be melted by laser irradiation.

It is preferable that the method of repairing a pixel defect of the circuit substrate include a step in which the patterned film that is electrically reconnected to the first wiring line is separated from the other patterned films.

The present invention is also a method of manufacturing the circuit substrate including a step to repair a pixel defect by using the method of repairing a pixel defect of the present invention.

The present invention is also a method of manufacturing the display device in which the process of manufacturing the circuit substrate uses the method or repairing a pixel substrate of the present invention.

The respective configurations mentioned above may be appropriately combined within a scope that does not depart from the gist of the present invention.

Effects of the Invention

According to the circuit substrate of the present invention, a patterned film is disposed in a manner that can sufficiently reduce the increase in capacitance and sufficiently minimize the degradation of display quality due to signal delay, while sufficiently shielding the part where the a light shielding member damaged with the patterned film.

DETAILED DESCRIPTION OF EMBODIMENTS

Figure 1:
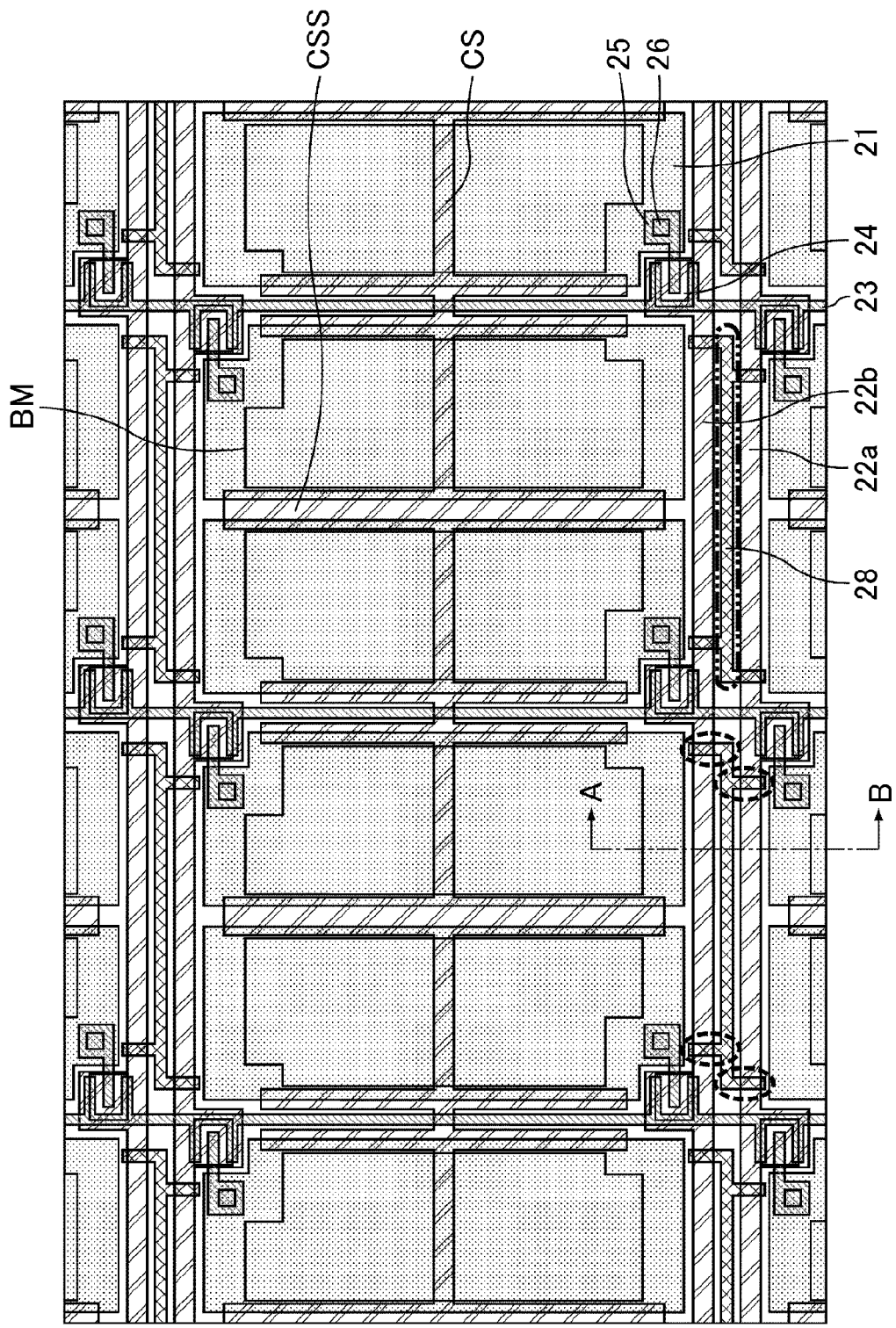
FIG. 1 is a schematic plan view of Working Example 1-1 showing a structure of a pixel of a circuit substrate.

Embodiments are described below and the present invention is described in further detail with reference to the drawings, but the present invention is not limited to these embodiments. In the present specification, pixels may refer to sub pixels unless stated otherwise. Furthermore, the circuit substrate (first substrate) of the present embodiment is also referred to as a TFT substrate or array substrate, because the circuit substrate has thin film transistor elements (TFTs).

In the present embodiment, a circuit substrate is an active matrix circuit substrate.

In the present specification, if it is mentioned that a patterned film or the like is provided in the same layer as another member, then it means that the patterned film and the other member is in contact with a common member (insulating layer, liquid crystal layer, or the like, for example) on the liquid crystal layer side thereof and/or on the side opposite to the liquid crystal layer side thereof. Furthermore, in the figures, even if the digit of the reference numbers in the hundred's place and the thousand's place are different, if the digit in the one's place and in the ten's place are the same, then the reference number refer to the same member unless otherwise stated. In the figures, characteristic portions of the respective embodiments are surrounded by dotted lines.

Embodiments are described below and the present invention is described in further detail with reference to the drawings, but the present invention is not limited to these embodiments.

(Embodiment 1:Patterned Film Disposed on Source Wiring Line (for Each Subpixel))

On a circuit substrate having a dual-gate structure, a patterned film (or, repair wiring line) is disposed between adjacent scan signal lines.

A basic structure of a liquid crystal display device of Embodiment 1 includes a TFT substrate (active matrix substrate) that is a circuit substrate, a color filter substrate (opposite substrate), and a display medium (liquid crystal) sandwiched between these two substrates. There is no special limitation on the alignment mode, alignment method, and driving method of liquid crystals, and TN (twisted nematic) mode, MVA (multi-domain vertical alignment) mode, IPS (in-plane switching) mode, FFS (fringe field switching) mode, or TBA (transverse bend alignment) mode can be adopted. Furthermore, the present embodiment can be suitably used in PSA (polymer sustained alignment) technology, photoalignment technology, and multi-pixel structure technology. A multi-pixel structure is a structure in which each subpixel electrode is driven by respective individual TFTs. Furthermore, there is no limit to the shape of the pixel, the pixel can be a vertically long pixel as shown, a horizontally long pixel, or in a delta pattern.

In Embodiment 1, a circuit substrate having a dual gate structure is disposed with a patterned film as a repair wiring line between adjacent gate wiring lines in the source layer. The patterned film is disposed between the pixel electrodes and between the gate wiring lines (an advantage is that a light-shielding effect can be obtained in case a light shielding member is damaged).

In Embodiment 1, a patterned film can be formed for a layer forming conventional TFTs. As a result, a process of forming a new layer (photolithography process) is not needed, and therefore, there are no additional steps. Furthermore, a new mask is not needed, and thus, cost does not increase. Furthermore, in a configuration of Embodiment 1, a projection is provided on the top and bottom of the line-shaped portion of a patterned film, and repair can be performed for both top and bottom gate wiring lines. It is preferable that a projection be provided on the top and bottom of the line-shaped portion of the patterned film, but the effect of the present invention can be achieved by having a plurality of similar projections on one side of the line-shaped portion of the patter film. Furthermore, in Embodiment 1, the effect of the electric field of the gate wiring line upon a pixel can be made smaller. As a result, a change in pixel potential due to an electric field of the gate wiring line becomes small, and thus a desirable color can be displayed.

Working Example 1-1

Figure 2:
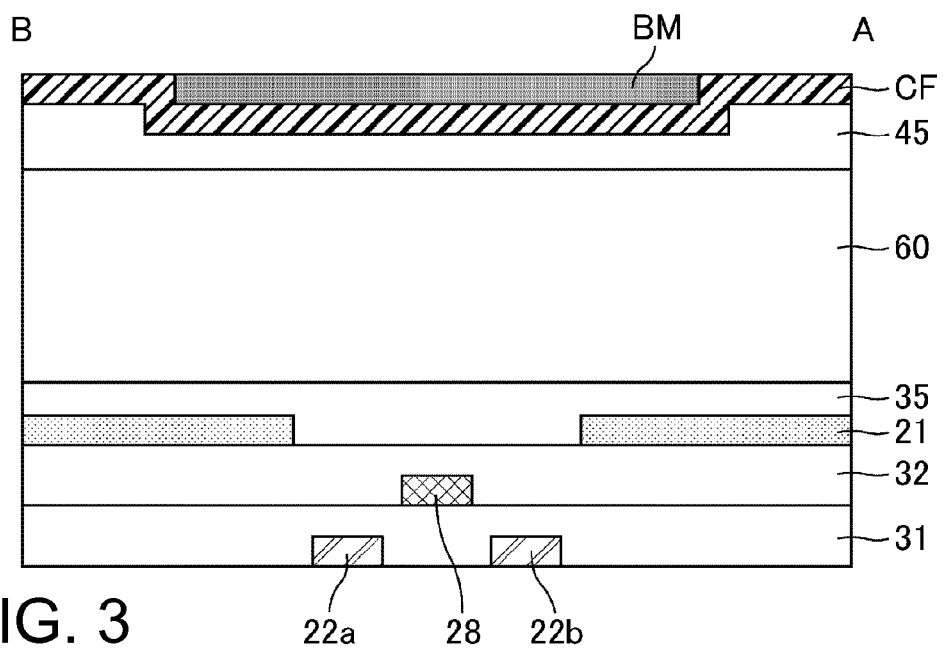
FIG. 2 is a schematic cross-sectional view showing the circuit substrate in FIG. 1 along the line A-B.

FIG. 1 is a schematic plan view of Working Example 1-1 showing a structure of a pixel of a circuit substrate. FIG. 2 is a schematic cross-sectional view showing the circuit substrate in FIG. 1 along the line A-B. Working Example 1-1 is a configuration in which two projections each for repairing are provided on the top and the bottom of the patterned film (portion surrounded by dotted lines in FIG. 1.) Working Example 1-1 has the smallest capacitance out of all the working examples of Embodiment 1.

In a circuit substrate of Working Example 1-1, the patterned film 28 has a plurality of projections on both sides in the widthwise directions of the line-shaped portion such that a plurality of projections have an overlapping portion that overlaps the two first wiring lines across a first insulating film 31. It is preferable that the thickness of the first insulating film 31 be 3000 Å or greater. Furthermore, it is preferable that the upper limit be less than or equal to 5000 Å.

As for a circuit substrate of Working Example 1-1, light-shielding of the damaged part of the light-shielding member can be sufficiently performed using the patterned film in the location surrounded by a two-dot chain line. This is the same for embodiments mentioned later.

The pixel electrodes 21 are formed of a transparent conductive film such as ITO (indium tin oxide), IZO (indium zinc oxide), tin oxide, zinc oxide, or the like. An insulating film such as the first insulating film 31 or the like can be formed of a material such as an acrylic resin, silicon nitride, or silicon oxide.

In the active matrix substrate having the above-mentioned configuration, it is possible to form the patterned film 28 of the same material and in the same step as the source wiring line (data signal line) 23 in order to simplify the manufacturing process and reduce the manufacturing cost. However, the patterned film 28 does not need to be formed with the same material as the source wiring line 23 nor be formed during the same step.

Working Example 1-2

Figure 3:
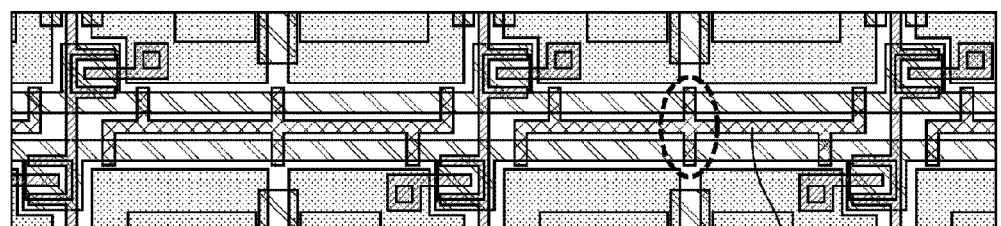
FIG. 3 is a schematic plan view of Working Example 1-2 showing a structure of a pixel of a circuit substrate.

FIG. 3 is a schematic plan view of Working Example 1-2 showing a structure of a pixel of a circuit substrate. In Working Example 1-2, the patterned film 128 has two or more projections for repairing (under Cs light shielding portion) on both the top and the bottom of the patterned film 128. This can act as a countermeasure against pin holes in a black matrix (BM), and also acts as a countermeasure against a gate electric field (the effect is relatively small compared to other examples of Embodiment 1). Furthermore, the capacitance between pixel electrodes can be reduced (effect is small).

In Working Example 1-2, the portion of a display device that should be shielded from light can be shielded from light with the patterned film 128 (portion where neither the pixel electrode nor the light-shielding film are present). Also, a portion between pixel electrodes (location where storage capacitance wiring light-shielding layer is disposed) can be shielded from light and mitigate the formation of pinholes. These effects are the same in Working Examples 1-3 and 1-4 as mentioned later.

As for a circuit substrate in Working Example 1-2, in the location surrounded by a two-dot chain line, light-shielding can be performed sufficiently at the damaged part of the light-shielding member using the patterned film. This is the same for embodiments mentioned later.

Working Example 1-3

Figure 4:
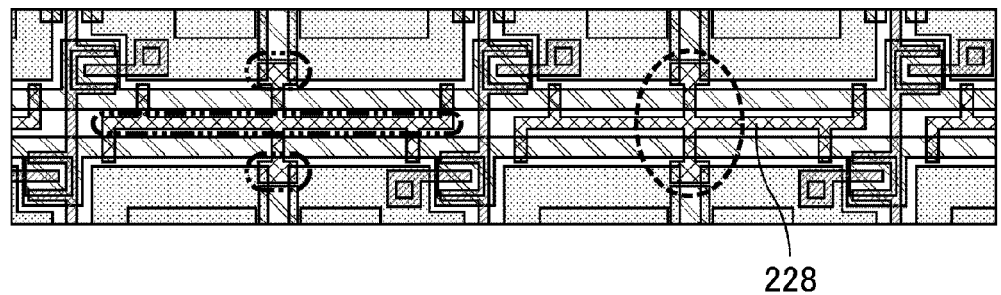
FIG. 4 is a schematic plan view of Working Example 1-3 showing a structure of a pixel of a circuit substrate.

FIG. 4 is a schematic plan view of Working Example 1-3 showing a structure of a pixel of a circuit substrate.

The structure has projections for repairing in two or more locations on the top and the bottom of a patterned film 228 (under light shielding portion of Cs/near storage capacitance wiring line (auxiliary electrode portion) Cs) (acts as a countermeasure against pinholes in the BM/gate electric field (medium effectiveness) (also acts as a countermeasure against capacitance between pixel electrodes (medium effectiveness) . The third projection is disposed between the pixel electrodes.

Working Example 1-4

Figure 5:
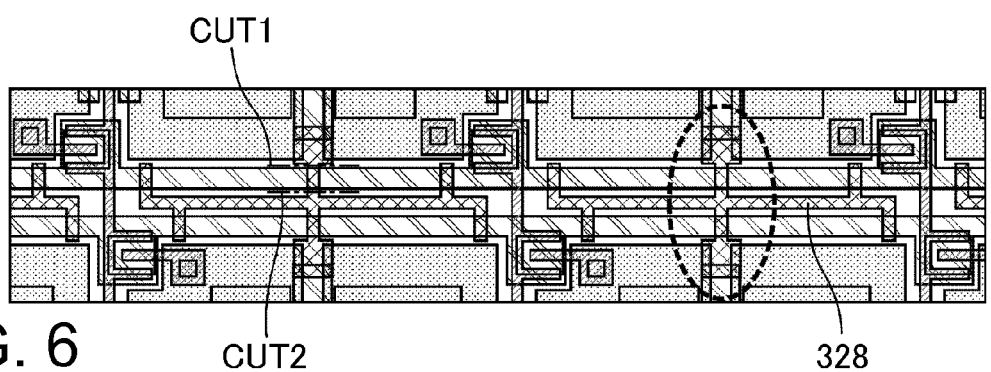
FIG. 5 is a schematic plan view of Working Example 1-4 showing a structure of a pixel of a circuit substrate.

FIG. 5 is a schematic plan view of Working Example 1-4 showing a structure of a pixel of a circuit substrate.

The structure has projections for repairing in two or more locations on the top and the bottom of a repair wiring line (under Cs light shielding portion/ near storage capacitance wiring line (auxiliary electrode portion) Cs (acts as a countermeasure against pinholes in the BM pinhole/gate electric field (highly effective) (also acts as a countermeasure against capacitance between pixel electrodes (highly effective). In an area surrounded by a dotted line, the structure in FIG. 5 has the third projections disposed between pixel electrodes where the storage capacitance wiring line Cs is, such that the third projections overlap the auxiliary electrode portion.

Unwanted portions of the patterned film can be cut out. When performing repair in a structure such as that of Working Example 1-4 in which the extending portion of the storage capacitance wiring line Cs overlaps a projection of the patterned film, it is preferable that the portion where the extending portion of the storage capacitance wiring line Cs and the projection of the patterned film overlap, or in other words, that the root of the projection of the patterned film (CUT1 or CUT2 shown in FIG. 5, for example) be cut, for example. The location to be cut may be either CUT1 or CUT2.

The effect of performing the cut is described below. The gate wiring line repeatedly switches between high potential Vgh and low potential Vgl, and the storage capacitance wiring line Cs has a fixed Cs potential in dot inversion driving, but repeatedly switches between a high Cs potential and a low Cs potential in line inversion driving.

The extending portion of the storage capacitance wiring line Cs and the projection of the patterned film have an insulating film therebetween, and thus there are no crucial disadvantages in terms of quality, but if wiring lines with different voltages are nearby, both are affected by the voltage of the other wiring line to a certain degree.

Thus, if repair is performed in a structure in which the extending portion of the storage capacitance wiring line Cs and the projection of the patterned film overlap, it is preferable that the portion where the extending portion of the storage capacitance wiring line Cs and the projection of the patterned film overlaps, or in other words, the root of the projection of the patterned film be cut, and thus removing the projection of the patterned film. The removal of a projection of the patterned film is similarly effective in other embodiments in which the extending portion of the Cs and the projection of the patterned film overlaps.

Working Example 1-5

Figure 6:
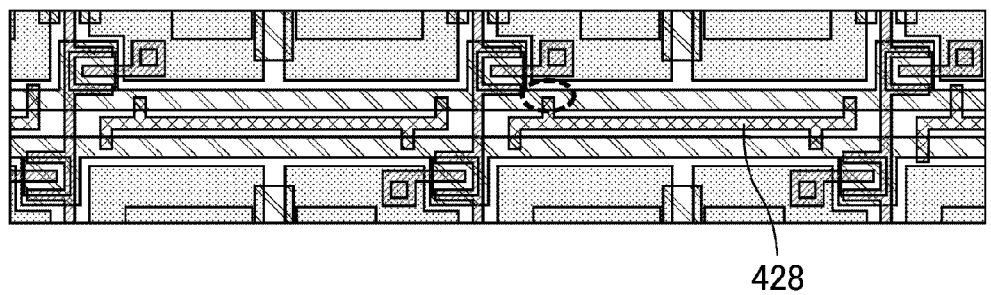
FIG. 6 is a schematic plan view of Working Example 1-5 showing a structure of a pixel of a circuit substrate.

FIG. 6 is a schematic plan view of Working Example 1-5 showing a structure of a pixel of a circuit substrate.

The tip of the projection for repairing may protrude outside a gate wiring line as in Working Example 1-1/Working Example 1-2, or not protrude outside a gate wiring line as in Working Example 1-5, respectively.

If the projections protrude outside, then the repair rate improves and repair becomes easier. If the projections do not protrude outside, then the capacitance decreases, and the panel has less capacitance. As a result, lower power consumption can be attained.

It is preferable that the distance in micrometers, for example, between a patterned film (repair wiring line) and a pixel electrode be 7 and 25 μm.

The following details are assumed. In a normal design, it can be assumed that the distance between the pixel electrode and the repair wiring line is approximately 15 μm.

In other words, usually the distance between the pixel electrode and the gate wiring line is 8 μm, but it is preferable that the distance be 2 μm to 10 μm. Usually, the width of the gate wiring line is 5 μm, but it is preferable that the distance be 4 μm to 10 μm. Furthermore, the distance between the gate wiring line and the repair wiring line is usually assumed to be 2 μm, but it is preferable that the distance be 1 μm to 5 μm. The sum of these is usually approximately 15 μm, for example, but it is preferable that the sum be 7 μm to 25 μm.

In the present embodiment, a gate electrode that is connected to a gate wiring line is disposed on a transparent insulating substrate such as glass or plastic. The gate wiring line and the gate electrode are formed by first forming a metal film, an alloy film, or a multilayer film of titanium, chromium, aluminum, molybdenum, tantalum, tungsten, copper, or the like having a thickness of 1000 Å to 3000 Å by sputtering or the like, and then patterned into a desired shape by photoetching or the like.

In the present embodiment, the patterned film and the gate wiring line can be electrically connected to each other by irradiating the patterned film by a laser or the like at the projection thereof.

Therefore, in the active matrix substrate of the present embodiment, even if a disconnection occurs in a wiring line, the wiring line can be repaired by electrically connecting at least two locations in the patterned film and the gate wiring line.

As shown in FIG. 1, in the present embodiment, the pattern of the patterned film is in a quadrilateral shape (four sided shape), but the pattern of the patterned film 28 is not limited to this, and may be in a triangular shape, semicircular shape, a trapezoid shape, or the like. In other words, it is preferable that the structure of the projection of the patterned film 28 be provided so as to overlap the gate wiring line with an insulating film therebetween such that a region for irradiating a laser is secured.

(Embodiment 2: Disposing Patterned Film in Source Wiring Line Layer)

In Embodiment 2, a patterned film is disposed between adjacent scan signal lines on a circuit substrate having a dual-gate structure.

A basic structure of a display device of Embodiment 2 includes a TFT substrate (active matrix substrate) that is a circuit substrate, a color filter substrate (opposite substrate), and a display medium (liquid crystals) sandwiched between these two substrates. There is no limitation regarding the alignment mode, alignment method, and the driving method of the liquid crystals (TN, MVA, IPS, FFS, TBA, PSA, photoalignment, multi-pixel). Furthermore, there are no limitations regarding pixel shape, the pixels may be vertically long pixels, horizontally long pixels, or in a delta pattern.

In a circuit substrate having a dual-gate structure, a patterned film is disposed in the source wiring line layer and between gate wiring lines. In a manner similar to Embodiment 1, a repair wiring line can be formed in a conventional TFT layer (manufacturing process). As a result, a process of forming a new layer (photolithography process) is not needed, and therefore there are no additional steps. Furthermore, a new mask is not needed, and thus, the cost does not increase. Both top and bottom gate wiring lines can be repaired. Also, the gate wiring lines can be repaired regardless of where the disconnection occurs.

Working Example 2-1

Figure 7:
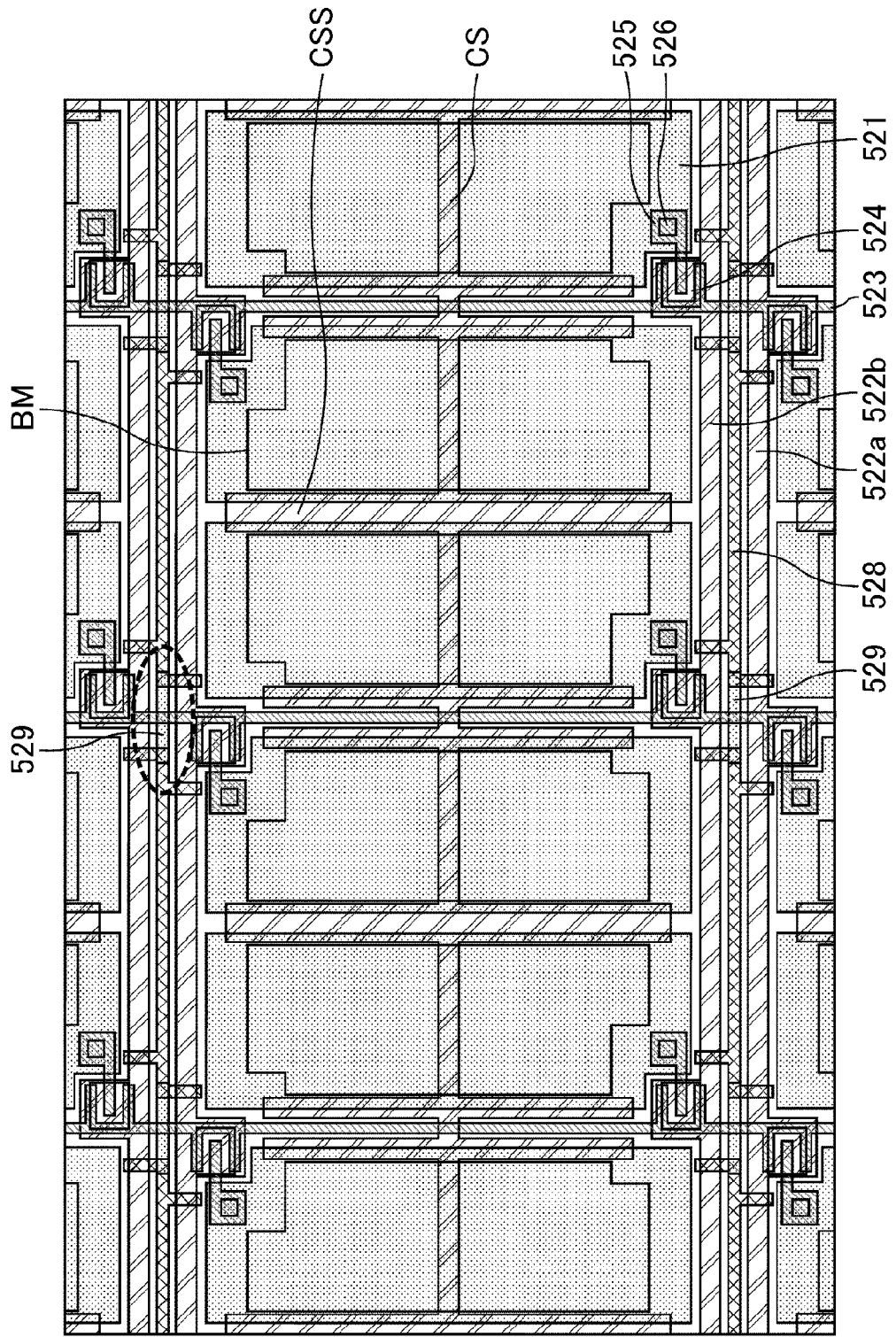
FIG. 7 is a schematic plan view of Working Example 2-1 showing a structure of a pixel of a circuit substrate.

FIG. 7 is a schematic plan view of Working Example 2-1 showing a structure of a pixel of a circuit substrate.

A pixel electrode 521 and a transparent film 529 of the same film (location surrounded by a dotted line in FIG. 7, for example) are disposed between patterned films (repair wiring lines) as a countermeasure against complete disconnection in the gate wiring lines 522*a* and 522*b*. When repair is being performed, an extra step of radiating a laser is needed, but the increase in capacitance is small. In Working Example 2-1, a transparent film 529 that is the same as the pixel electrode is provided in the same layer as the pixel electrode, but instead of the transparent film 529 that is the same material as the pixel electrode, a conductive film that is formed of a different material from that of the pixel electrode can be provided.

Working Example 2-2

Figure 8:
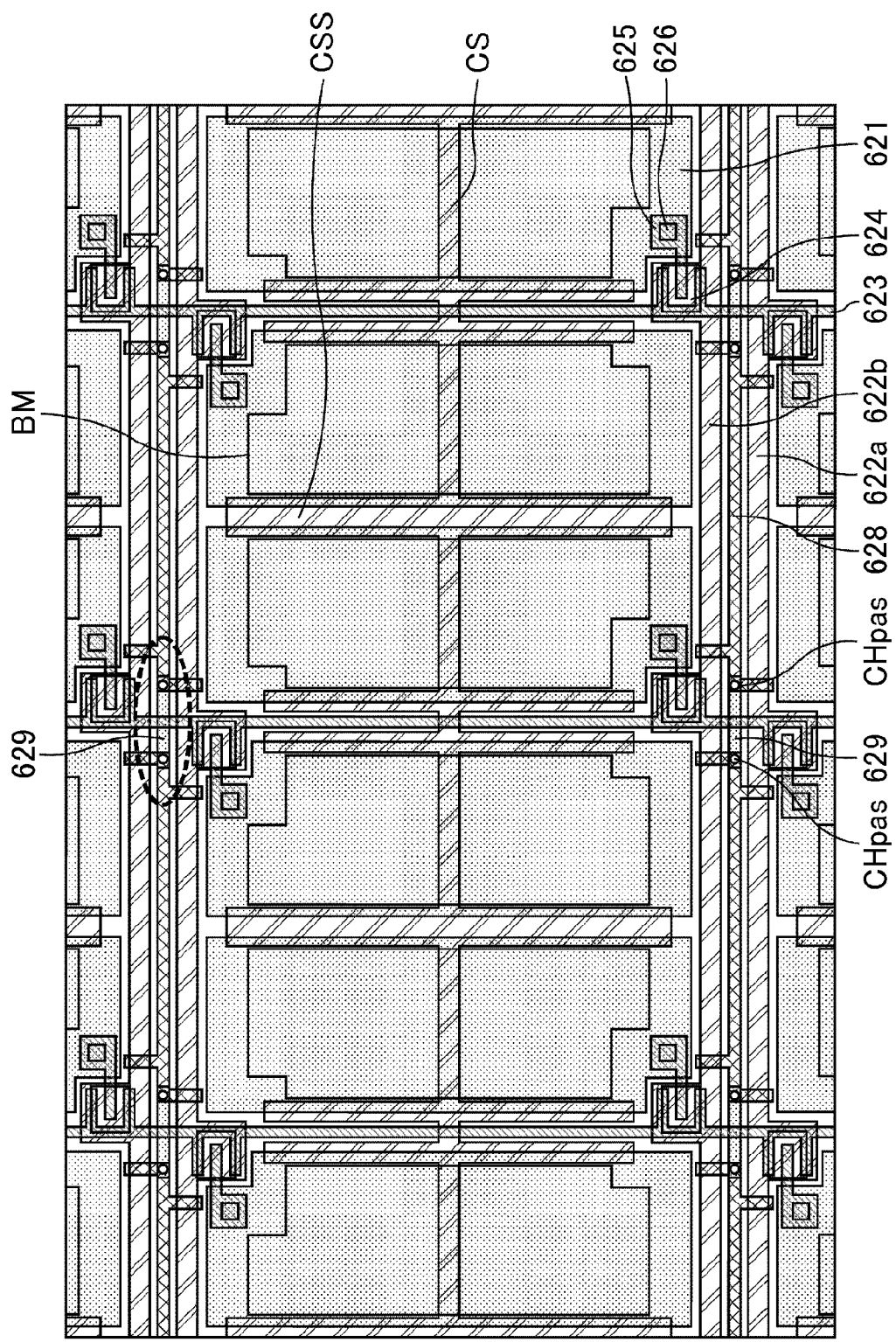
FIG. 8 is a schematic plan view of Working Example 2-2 showing a structure of a pixel of a circuit substrate.

FIG. 8 is a schematic plan view of Working Example 2-2 showing a structure of a pixel of a circuit substrate.

A transparent film 629 that is the same film as a pixel electrode 621 is formed between patterned films (repair wiring lines), and the patterned film and the transparent film are connected in advance through a hole CHpas formed in an insulating film (countermeasure against complete disconnection in the gate wiring lines). When repair takes place, the laser does not need to be radiated to connect the repair wiring line and the transparent film as in Embodiment 2-1, but the capacitance increases.

However, to connect the patterned film and the gate wiring line, a laser must be radiated. In Working Example 2-2, a transparent film 629 that is the same as the pixel electrode is provided in the same layer as the pixel electrode, but instead of the transparent film 629 that is the same as the pixel electrode, a different conductive film may be provided. The other structures of the present embodiment are the same as described above in Embodiment 1.

(Embodiment 3: Patterned Film is Formed in a New Layer (Patterned Film can be Disposed Over Pixel and Thus Gate Wiring Line can be Repaired Regardless of where a Disconnection is Present))

In a circuit substrate with a dual-gate structure, a new layer that is not conventionally provided is disposed between adjacent scan signal lines, and a repair wiring line is provided thereon.

A basic structure of a display device of Embodiment 3 includes a TFT substrate (active matrix substrate), a color filter substrate (opposite substrate), and a display medium (liquid crystals) sandwiched between these two substrates.

There is no limitation regarding the alignment mode, alignment method, and the driving method of the liquid crystals (TN, MVA, IPS, FFS, TBA, PSA, photoalignment, multi-pixel). Furthermore, there are no limitations regarding pixel shape, the pixels may be vertically long pixels, horizontally long pixels, or in a delta pattern.

A patterned film is disposed between pixel electrodes (advantage in obtaining a light-shielding effect). Repair can be performed regardless of where the gate wiring line is disconnected. Both top and bottom gate wiring lines can be repaired. Also, in Embodiment 3, because the number of projections for repairing is reduced, the capacitance of the gate wiring line can be decreased.

Working Example 3-1

Figure 9:
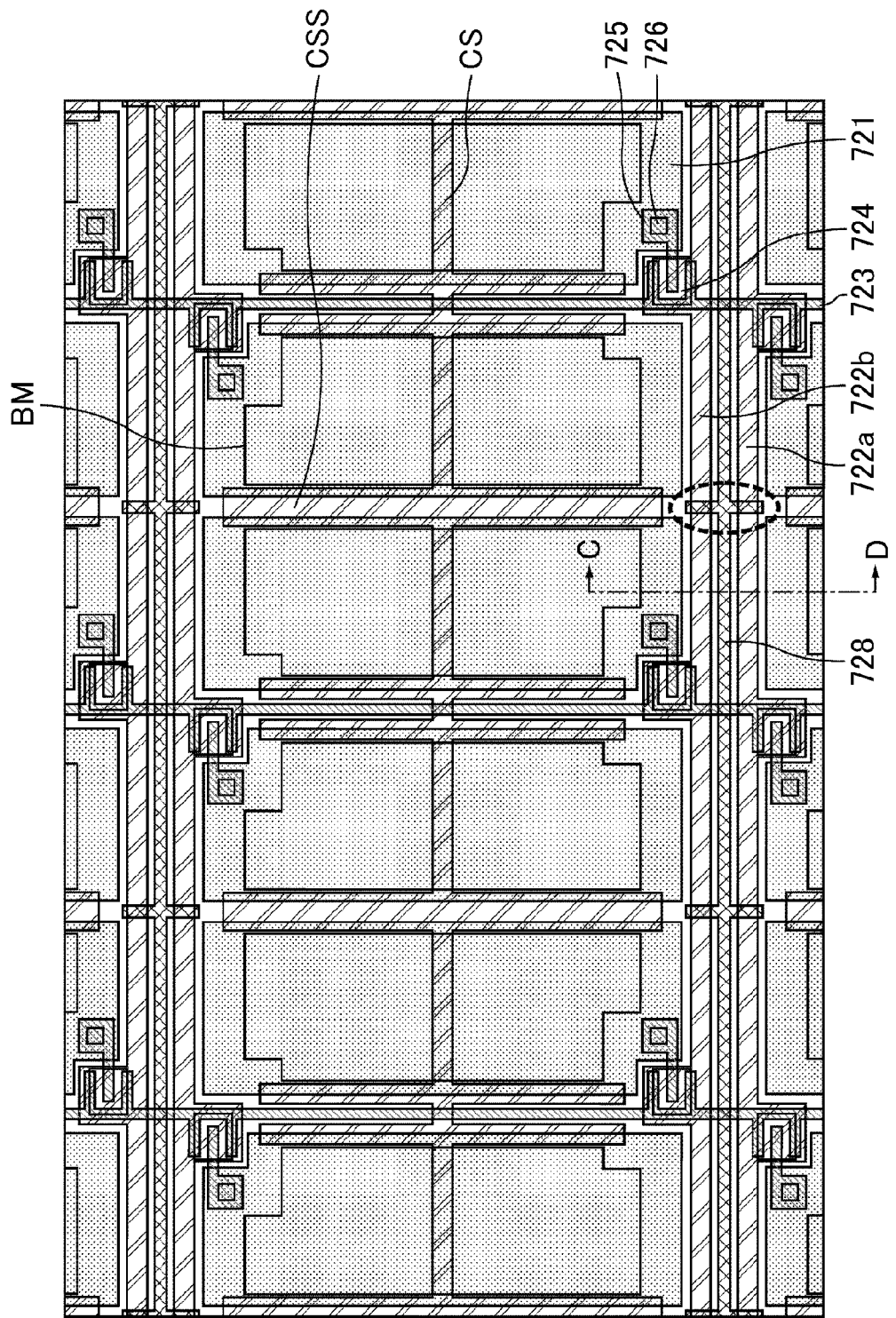
FIG. 9 is a schematic plan view of Working Example 3-1 showing a structure of a pixel of a circuit substrate.
Figure 10:
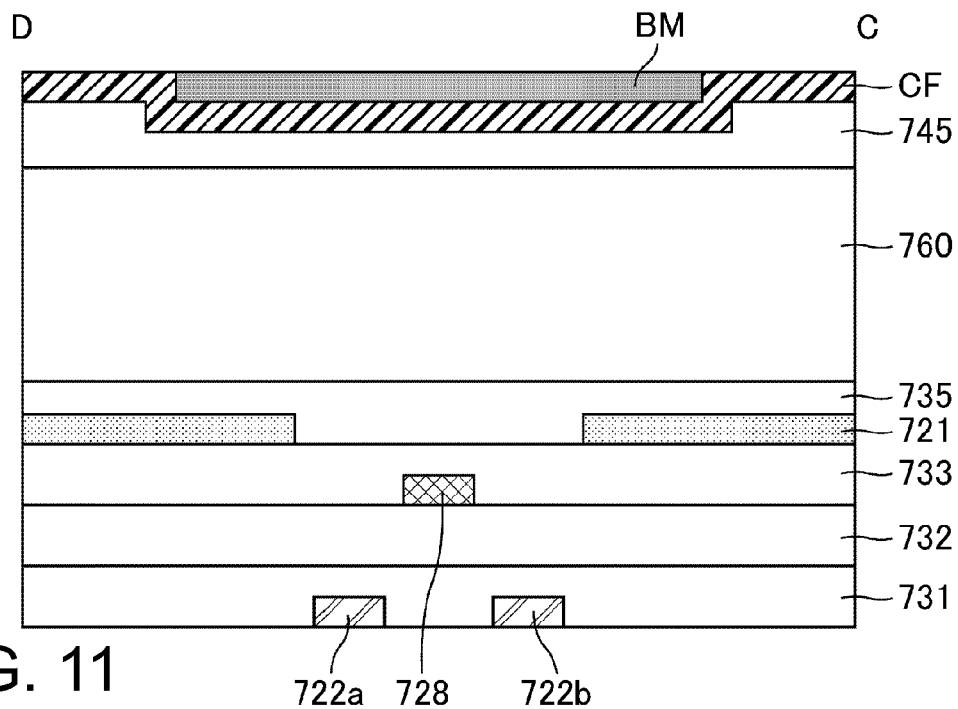
FIG. 10 is a schematic cross-sectional view showing the circuit substrate in FIG. 9 along the line C-D.

FIG. 9 is a schematic plan view of Working Example 3-1 showing a structure of a pixel of a circuit substrate. FIG. 10 is a schematic cross-sectional view showing the circuit substrate in FIG. 9 cut along a line C-D. In FIG. 10, a repair wiring line 728 and a third insulating film 733 are provided as a new layer.

The structure has a patterned film (repair wiring line) with a projection for repairing on both the top and the bottom thereof (below the Cs light-shielding portion). This acts as a countermeasure for BM pinholes and gate electric fields (low effectiveness). Furthermore, this acts as a countermeasure for the capacitance between pixel electrodes (low effectiveness).

Out of the three embodiments, the capacitance of Working Example 3-1 is the smallest (because only the repairing portion of the repair wiring line overlaps the gate wiring line).

Working Example 3-2

Figure 11:
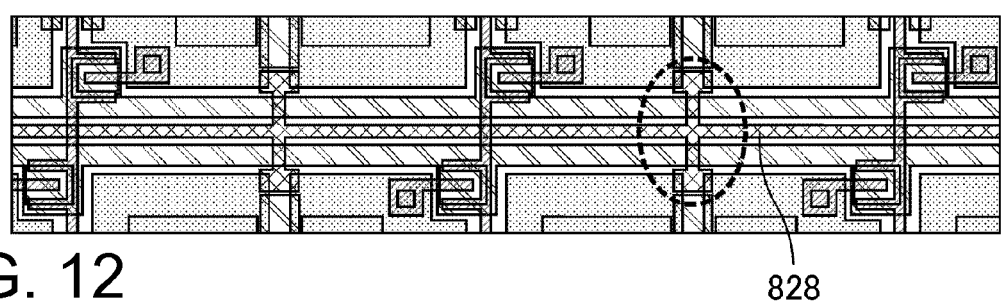
FIG. 11 is a schematic plan view of Working Example 3-2 showing a structure of a pixel of a circuit substrate.

FIG. 11 is a schematic plan view of Working Example 3-2 showing a structure of a pixel of a circuit substrate.

The structure thereof is provided with one projection for repairing on the top and the bottom of the patterned film 828 respectively. In this configuration, the projection for repairing is disposed between the pixel electrodes, and does not overlap the auxiliary electrode portion (below Cs light-shielding portion/to a vicinity of Cs). This acts as a countermeasure against pinholes in the BM and gate electric fields (medium effectiveness). It is also a countermeasure against the capacitance between pixel electrodes (medium effectiveness).

The portion that should be shielded from light can be shielded from light. The influence of the electric field of the gate wiring line on a pixel can also be reduced. As a result, a change in pixel potential due to an electric field of the gate wiring line becomes small, and thus, a desirable color can be displayed. The gap between pixel electrodes can also be shielded from light. Thus, the desired color can be displayed because the potentials of adjacent pixels do not influence each other. A similar effect can also be obtained in Working Example 3-3 that is described later.

Working Example 3-3

Figure 12:
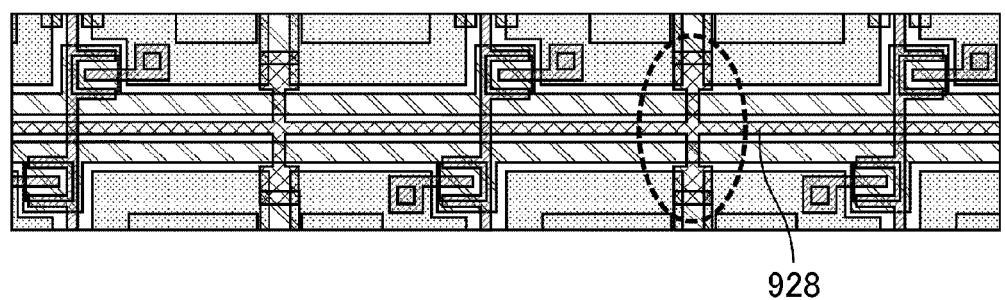
FIG. 12 is a schematic plan view of Working Example 3-3 showing a structure of a pixel of a circuit substrate.

FIG. 12 is a schematic plan view of Working Example 3-3 showing a structure of a pixel of a circuit substrate.

The structure thereof is provided with one projection for repairing the top and the bottom of the patterned film 928 respectively. In this configuration, the projection for repairing is disposed between the pixel electrodes, and overlaps the auxiliary electrode portion (below Cs light-shielding portion/ overlap Cs). This acts as a countermeasure against pinholes in the BM and gate electric fields (high effectiveness). It is also a countermeasure against the capacitance between pixel electrodes (high effectiveness).

It is preferable that the area in which the storage capacitance wiring line and the projection overlaps is 7 $\mu m^2$ to 39 $\mu m^2$. Details of the value can be seen in table 1 below. In table 1 below, "overlap of Cs and projection" refers to the vertical length of the overlapping area of the projection of a patterned film 928 and an auxiliary capacitance wiring line in FIG. 12. In table 1, "length in horizontal direction (width of light-shielding portion of Cs portion)" refers to the horizontal length of an area in which the projection of the patterned film 928 and the auxiliary capacitance wiring line overlap, and the "pixel electrode-Cs edge" thereof refers to where the pixel electrode and an edge of the auxiliary capacitance wiring line overlap and the "pixel electrode gap" refers to the length between the two pixel electrodes.

TABLE 1

| | | Length in Horizontal Direction (Width of Light-Shielding Portion of Cs Portion) | | |
|---|---|---|---|---|
| | Overlap of Cs and Projection | Pixel Electrode-Cs Edge | Pixel Electrode Gap | |
| Calculating Minimum Value | 1 μm × | {(1 μm × 2 locations) + | 5 μm} = | 1 × 7 = 7 |
| Calculating Maximum Value | 3 μm × | {(2.5 μm × 2 locations) + | 8 μm} = | 3 × 13 = 39 |

Working Example 3-4

Figure 13:
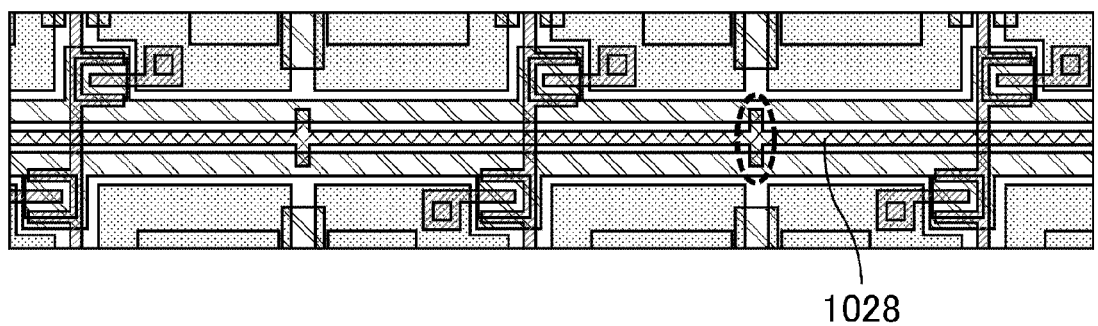
FIG. 13 is a schematic plan view of Working Example 3-4 showing a structure of a pixel of a circuit substrate.

FIG. 13 is a schematic plan view of Working Example 3-4 showing a structure of a pixel of a circuit substrate.

The tip of a projection for repairing may protrude outside the gate wiring line or not protrude outside as shown in FIG. 13 in the area surrounded by a dotted line. If the projections protrude outside, then the repair rate improves and repair becomes easier. If the projections do not protrude outside, then the capacitance decreases, and the panel has less capacitance. As a result, lower power consumption can be attained.

The other structures of the present embodiment are the same as described above in Embodiment 1.

(Embodiment 4: Forming Patterned Film in New Layer)

On a circuit substrate having a dual-gate structure, a patterned film is disposed between adjacent scan signal lines in a new layer different from a conventional layer.

A basic structure of a display device of Embodiment 4 includes a TFT substrate (active matrix substrate), a color filter substrate (opposite substrate), and a display medium (liquid crystals) sandwiched between these two substrates.

There is no limitation regarding the alignment mode, alignment method, and the driving method of the liquid crystals (TN, MVA, IPS, FFS, TBA, PSA, photoalignment, multi-pixel). There are no limitations regarding pixel shape, the pixels may be vertically long pixels, horizontally long pixels, or in a delta pattern. A patterned film is disposed between pixel electrodes in a location where the storage capacitance wiring line light-shielding layer is disposed (advantage of obtaining light-shielding effect).

Working Example 4-1

Figure 14:
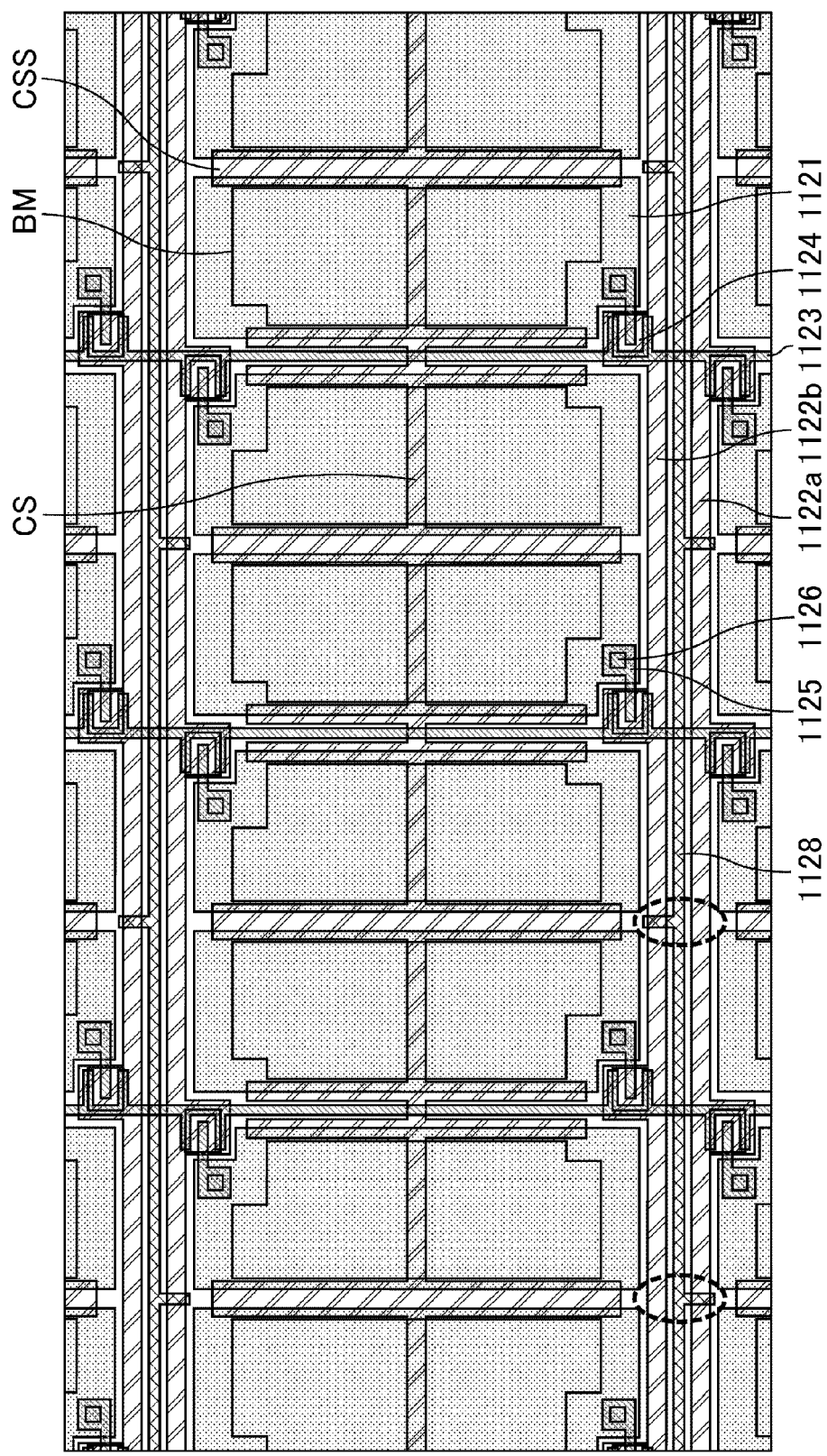
FIG. 14 is a schematic plan view of Working Example 4-1 showing a structure of a pixel of a circuit substrate.

FIG. 14 is a schematic plan view of Working Example 4-1 showing a structure of a pixel of a circuit substrate.

As shown in the location surrounded by a dotted line, the number of the top and the bottom projections for revision is halved (½). The capacitance when the panel is not repaired is small. The top and bottom disposed location is shifted. The structure is not limited to having one projection for four pixels.

Working Example 4-2

Figure 15:
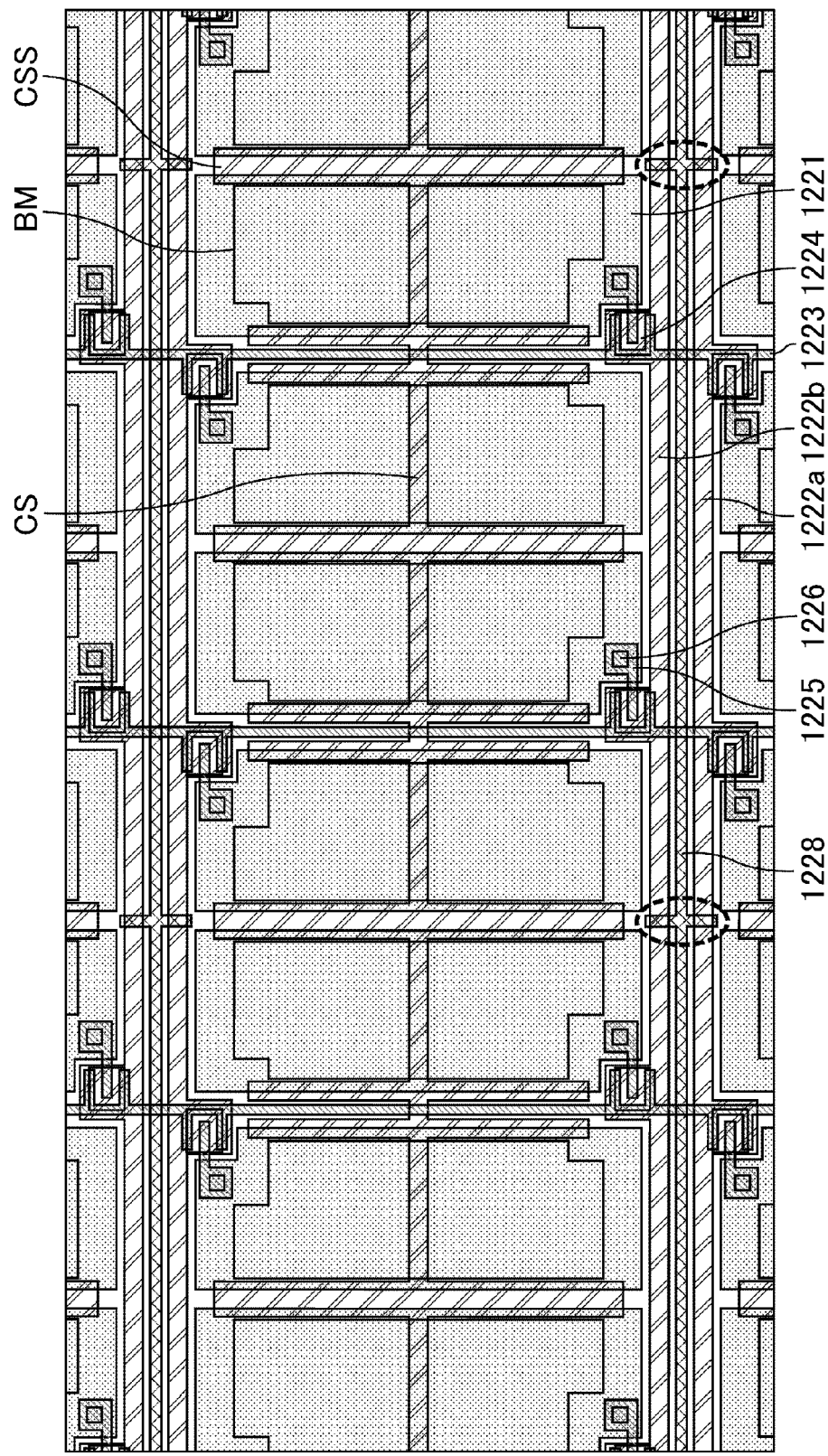
FIG. 15 is a schematic plan view of Working Example 4-2 showing a structure of a pixel of a circuit substrate.

FIG. 15 is a schematic plan view of Working Example 4-2 showing a structure of a pixel of a circuit substrate.

The number of the top and the bottom projections for repairing is halved (½). The positions of the bottom and the top projections are not shifted, but may be shifted (if shifted, it is similar to Working Example 4-1). The capacitance of the panel if not repaired is small (position of top and bottom may be the same). The structure is not limited to having one projection for four pixels.

Working Example 4-3

Figure 16:
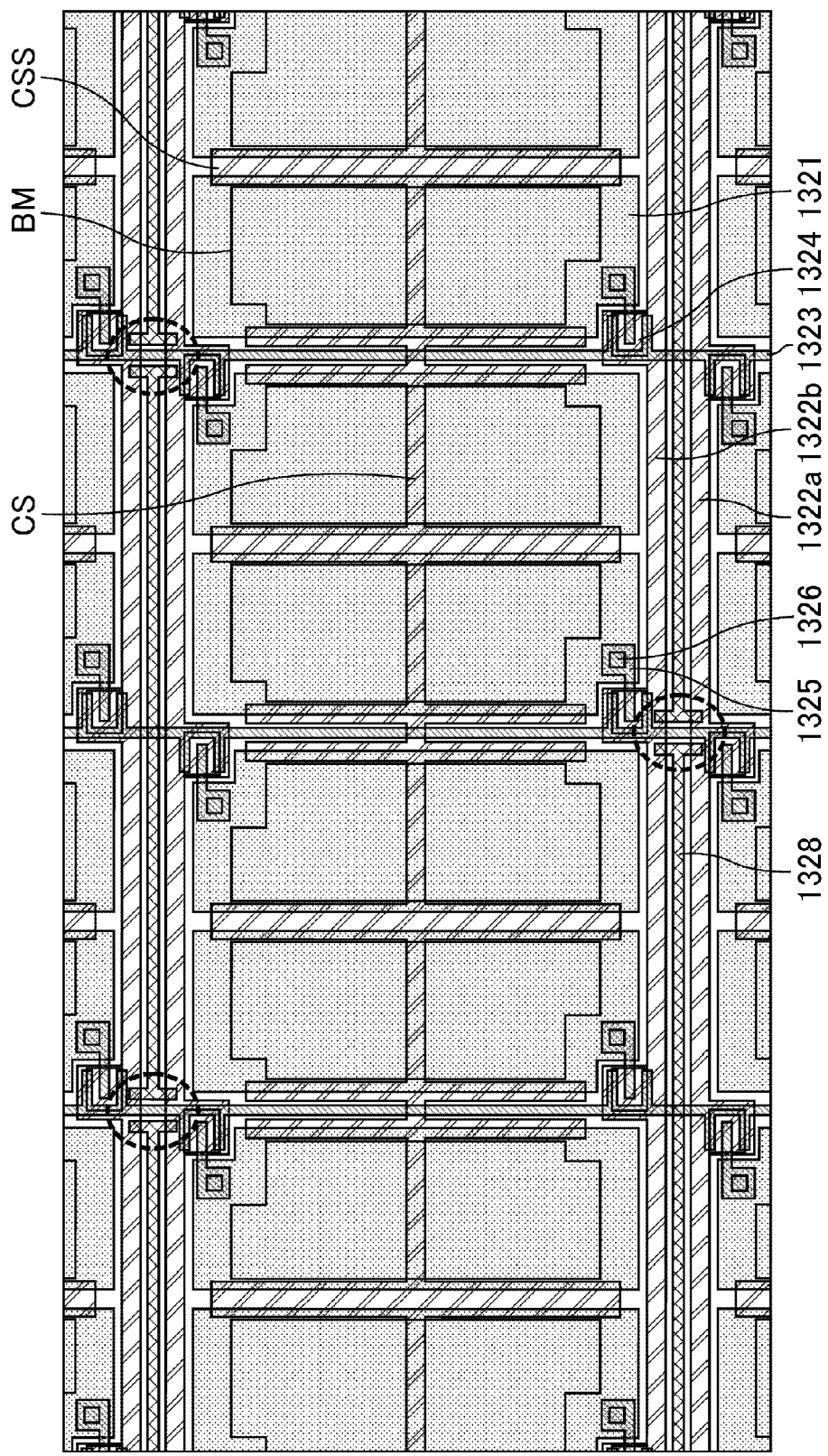
FIG. 16 is a schematic plan view of Working Example 4-3 showing a structure of a pixel of a circuit substrate.

FIG. 16 is a schematic plan view of Working Example 4-3 showing a structure of a pixel of a circuit substrate.

In Working Example 4-3, a source wiring line (data signal line) 1323 and a repair wiring line (patterned film) 1328 reduce the overlapping area by half (see area surrounded by dotted line). The cross capacitance between the source wiring line 1323 and the repair wiring line (patterned film) 1328 can be halved (½). If the overlapping area is shifted by two subpixels towards the gate wiring line (2 picture element shift), then the capacitances of all of the signal lines are the same. An embodiment such as in Embodiment 4-3 is especially suitable for making the capacitance the same for all signal lines. The structure is not limited to having one projection for four pixels.

Embodiment 4-4

Figure 17:
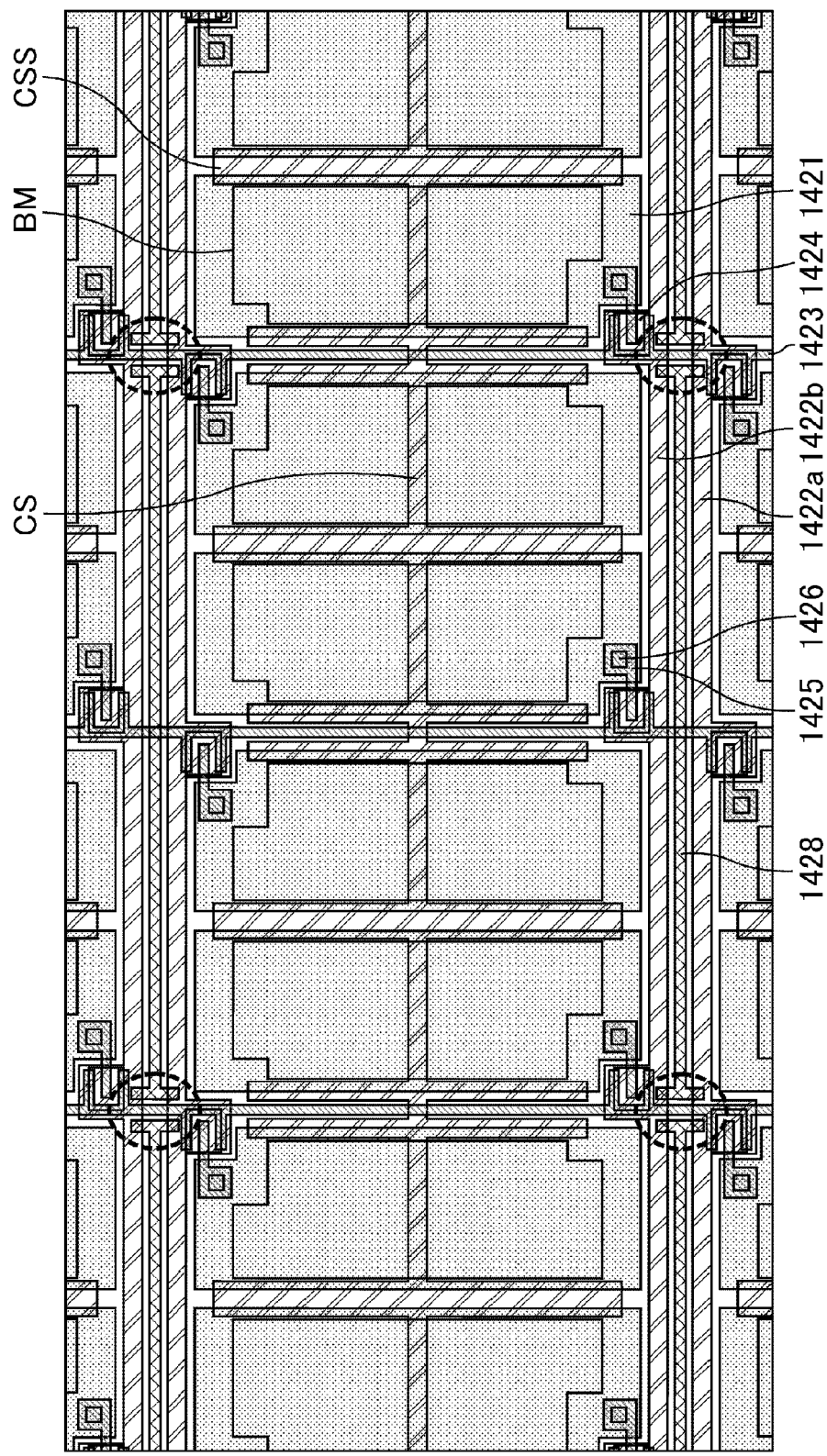
FIG. 17 is a schematic plan view of Working Example 4-4 showing a structure of a pixel of a circuit substrate.

FIG. 17 is a schematic plan view of Embodiment 4-4 showing a structure of a pixel of a circuit substrate.

In Embodiment 4-4, the cross capacitance between a source wiring line (data signal line) 1423 and a repair wiring line (patterned film) 1428 is halved. There are no shifts towards the gate wiring line. The structure is not limited to having one projection for four pixels.

In the structure in Embodiment 4-4, in a circuit substrate in which the lead-out wiring line of the source wiring line is alternately disposed on the two layers, the gate wiring line layer and the source wiring line layer, the load can be matched, and thus the structure can be suitably applied. In case the lead-out wiring line of the source wiring line has a different sheet resistance from the gate wiring line layer and the source wiring line layer, conventionally, in order to eliminate the difference in resistance of the lead-out wiring line, one of the two layers needed to be designed to be narrow, and thus, there was a risk of lower yield due to disconnection of the narrow wiring line, but as the load of the source wiring line in the active area is different, this difference may be canceled out by the lead-out wiring line, and therefore, there is no longer a need to design one of the lead-out wiring line to be narrow. As a result, an advantage that the yield for the peripheral lead-out line improves can be obtained.

(Effects)

(Whole Configuration)

Working Examples 4-1 and 4-2

Repair can be performed wherever a gate wiring line gets disconnected. Both top and bottom gate wiring lines can be repaired. Also, the capacitance can be reduced because the number of projections for repairing can be reduced.

Working Examples 4-3 and 4-4

Both top and bottom gate wiring lines can be repaired. Also, the capacitance can be reduced because the number of projections for repairing can be reduced.

Embodiment 4 is especially advantageous for small devices that require low power consumption, because the load of the source wiring line is halved, and thus, the power consumption is small.

(Details)

Working Example 4-1: capacitance is small when repair is not performed.

Working Example 4-2: capacitance is small when repair is not performed.

Working Example 4-3: capacitance of the source wiring line is reduced. This is a modified version of Working Example 4-4, and because the position is shifted for each gate wiring line, no difference in lag occurs for all signal lines.

Working Example 4-4: capacitance of the source wiring line is reduced.

The other structures of the present embodiment are the same as described above in Embodiment 1.

(Embodiment 5: Forming Repair Wiring Line in New Layer)

In a circuit substrate having a dual-gate structure, a new layer that is different from a layer that is conventionally provided between gate wiring lines (between adjacent scan signal lines) is provided, and a repair wiring line is disposed thereon.

A basic structure of a display device of Embodiment 5 includes a TFT substrate (active matrix substrate), a color filter substrate (opposite substrate), and a display medium (liquid crystals) sandwiched between these two substrates.

There is no limitation regarding the alignment mode, alignment method, and the driving method of the liquid crystals (TN, MVA, IPS, FFS, TBA, PSA, photoalignment, multi-pixel). There are no limitations regarding pixel shape, the pixels may be vertically long pixels, horizontally long pixels, or in a delta pattern. Also, repair can be performed wherever a gate wiring line gets disconnected. A patterned film is disposed between pixel electrodes (advantage in obtaining a light-shielding effect).

Figure 18:
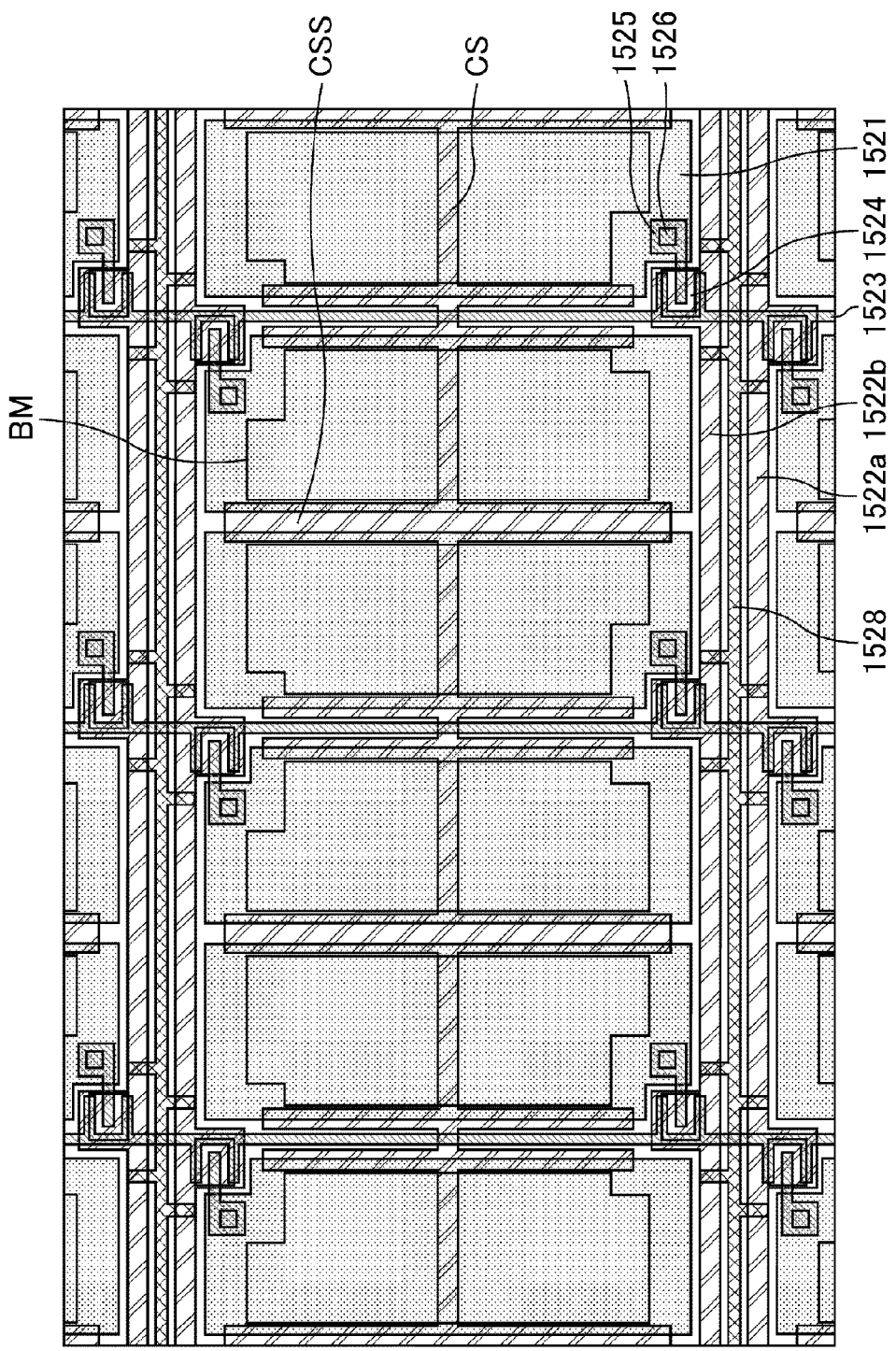
FIG. 18 is a schematic plan view of Working Example 5-1 showing a structure of a pixel of a circuit substrate.

FIG. 18 is a schematic plan view of Working Example 5-1 showing a structure of a pixel of a circuit substrate.

Projections for repair are not limited to a Cs shielding portion between pixel electrodes (Working Example 1-1-1 is formed on a new layer, and the structure has all lines connected). The number of projections for repairing is not limited and can be two or more for the top and the bottom of one picture element.

The position of the top and the bottom projections for repairing may be offset (can be selected as appropriate such as locations having an advantage in aperture ratio).

Working Examples 5-1 and 5-2

Repair can be performed wherever a gate wiring line is disconnected. Both top and bottom gate wiring lines can be repaired.

The other structures of the present embodiment are the same as described above in Embodiment 1.

<Embodiment 6>

Working Example 6-1

Figure 19:
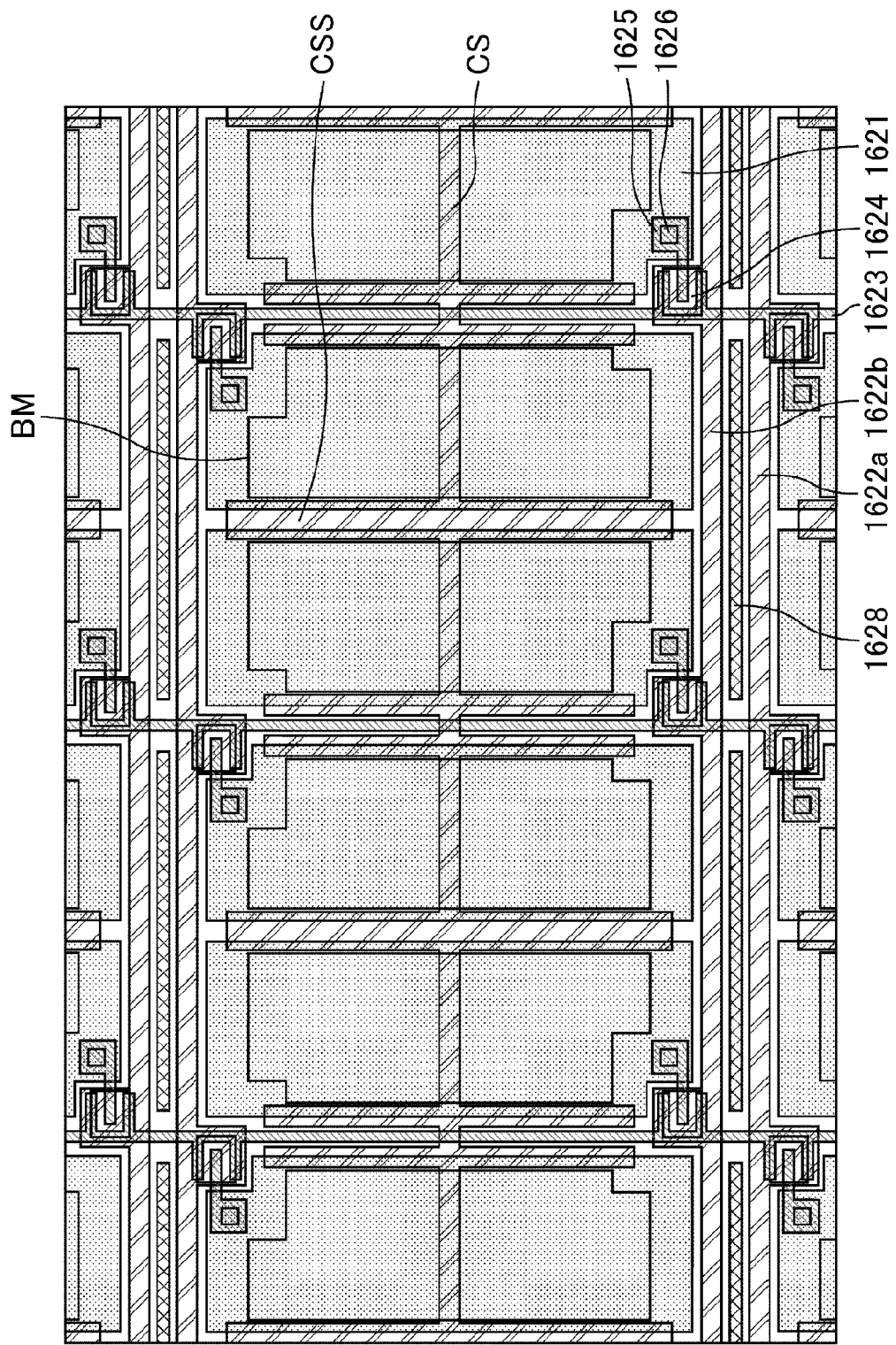
FIG. 19 is a schematic plan view of Working Example 6-1 showing a structure of a pixel of a circuit substrate.

FIG. 19 is a schematic plan view of Working Example 6-1 showing a structure of a pixel of a circuit substrate. A patterned film 1628 is provided on a source wiring line in a manner similar to Embodiments 1 and 2.

Working Example 6-2

Figure 20:
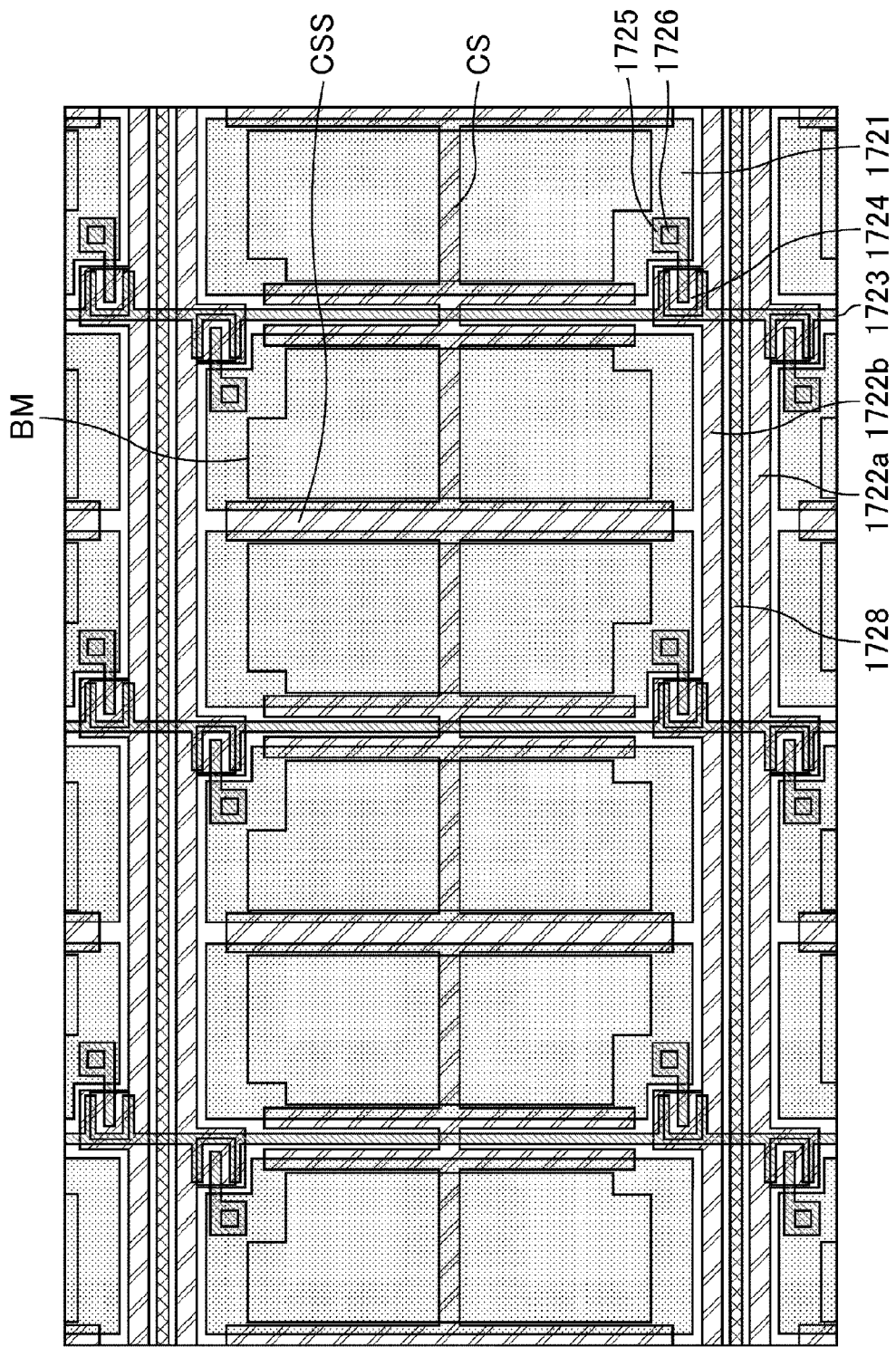
FIG. 20 is a schematic plan view of Working Example 6-2 showing a structure of a pixel of a circuit substrate.

FIG. 20 is a schematic plan view of Embodiment 6-2 showing a structure of a pixel of a circuit substrate. In a manner similar to Embodiments 3 to 5, a patterned film 1728 is formed on a new layer that is different from where the patterned film 1728 was conventionally provided. A configuration of a circuit substrate of the present invention can be confirmed by viewing the panel (or circuit substrate) or the like through a microscope.

The patterned film of Embodiment 6 does not function as a repair wiring line, but has a configuration in which the patterned film is disposed such that the capacitance increase can be sufficiently reduced, the decrease in display quality based on signal rounding be sufficiently suppressed, and light-shielding can be performed sufficiently in the damaged part of the light-shielding member by the patterned film. As in Embodiment 6, the entire patterned film may be a line-shaped portion.

Figure 22:
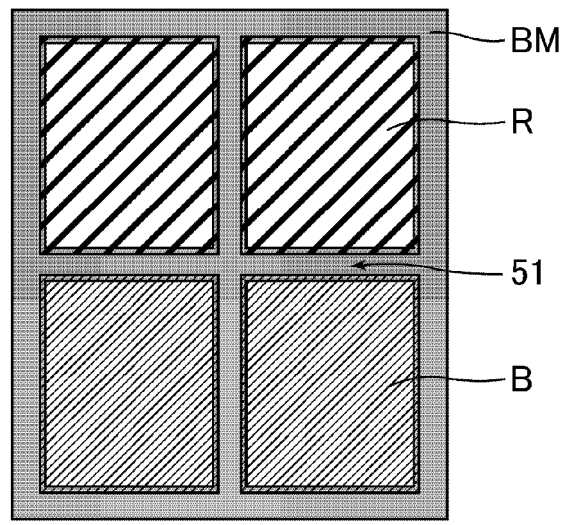
FIG. 22 is a schematic plan view showing a pixel of a circuit substrate provided in an active matrix liquid crystal display device.
Figure 23:
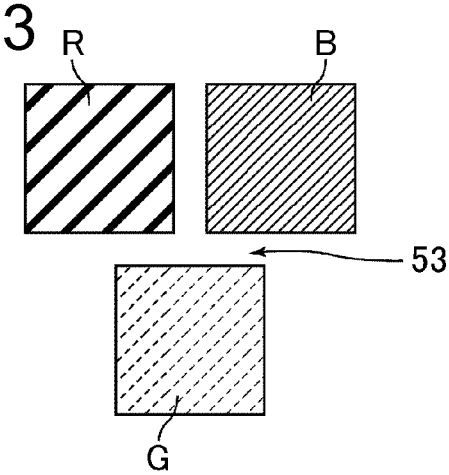
FIG. 23 is a schematic plan view showing a pixel having a delta pattern.

To dispose a patterned film such that capacitance increase can be sufficiently reduced means that a patterned film is disposed in an area including the area surrounded by a two-dot chain line in FIGS. 1 and 4, for example. For example, in a display device with pixels arranged in a striped pattern, it is preferable that the location shown as reference number 51 in FIG. 22 have no color filter and that the patterned film be provided in order to prevent damage to the BM. In a display device with pixels arranged in a delta pattern, it is preferable that a patterned film be provided in order to prevent damage to the BM at the location shown as reference number 53 in FIG. 23 where a top and bottom color boundary separating top and bottom occurs with ease.

<Modification Example of Embodiment 1>

Modification Example of Working Example 1-1

Figure 25:
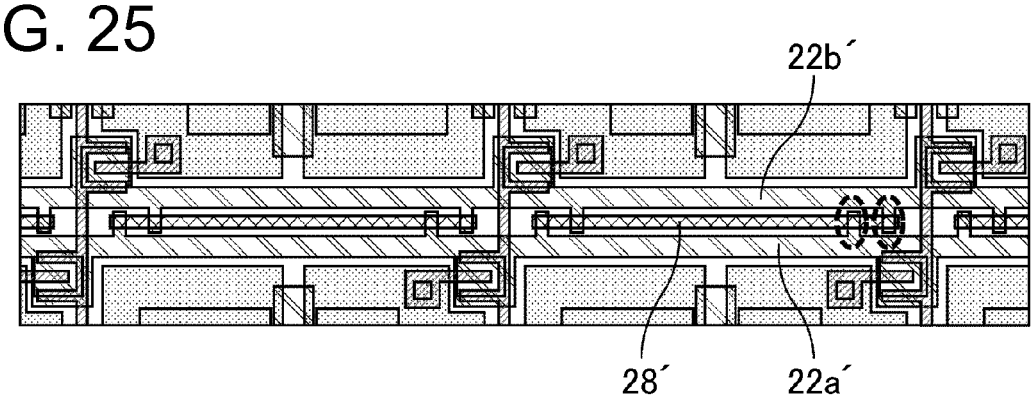
FIG. 25 is a schematic plan view of a modification example of Working Example 1-1 showing a structure of a pixel of a circuit substrate.

FIG. 25 is a schematic plan view of a modification example of Embodiment 1-1 showing a structure of a pixel of a circuit substrate. The respective working examples were provided with a projection on the patterned film such that the patterned film functions as a repair wiring line, but the modification example of the embodiment 1-1 has projections on the gate wiring lines 22a' and 22b' instead of the patterned film, and when the main surface of the substrate is seen in a plan view, the projections of the gate wiring lines 22a' and 22b' and the patterned film 28' overlap. Even this type of configuration allows the patterned film 28' to desirably function as a repair wiring line and the effect of the present invention can also be achieved in a similar manner.

(Comparison Example 1)

Figure 26:
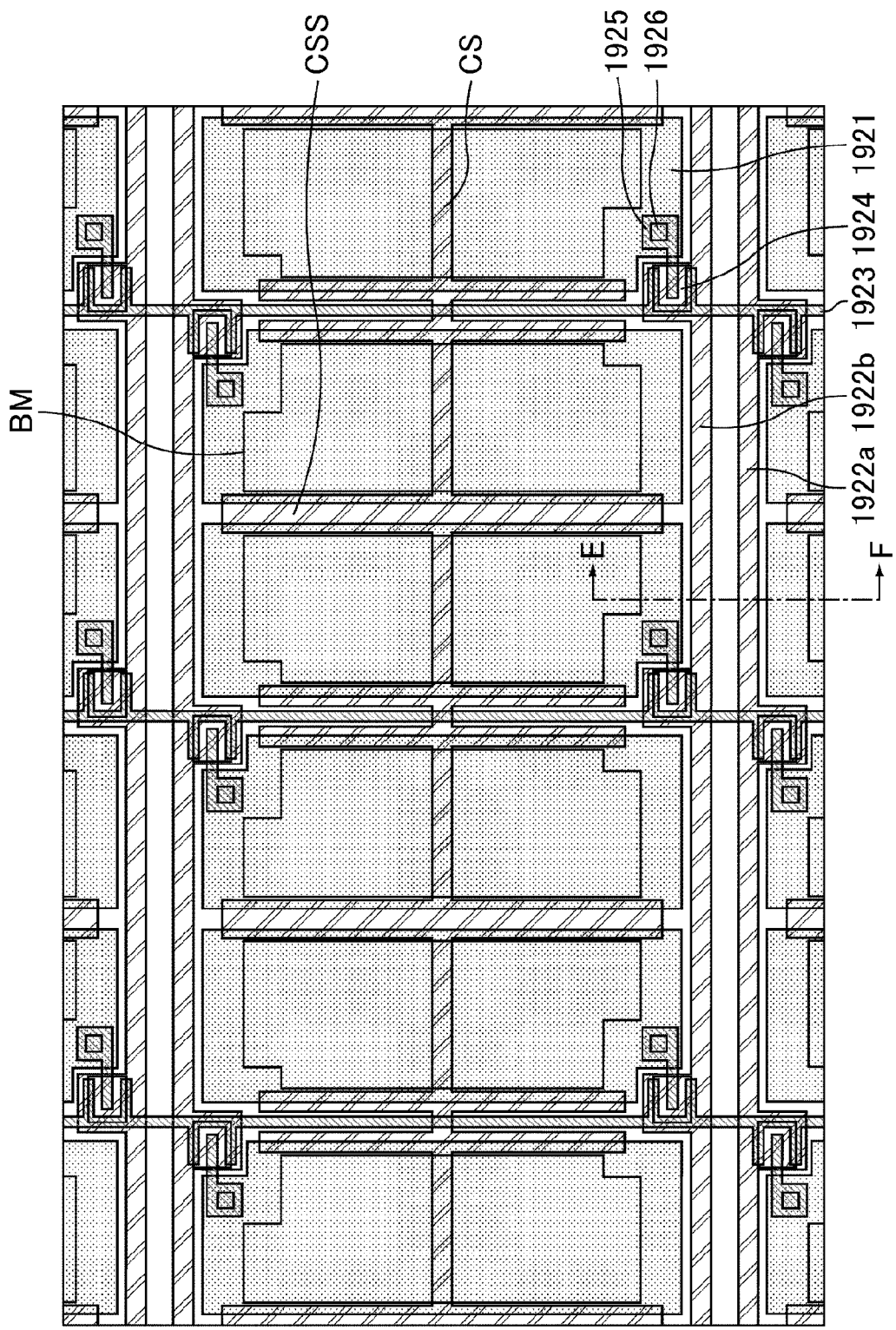
FIG. 26 is a schematic plan view of a Comparison Example 1 showing a structure of a pixel of a circuit substrate.
Figure 27:
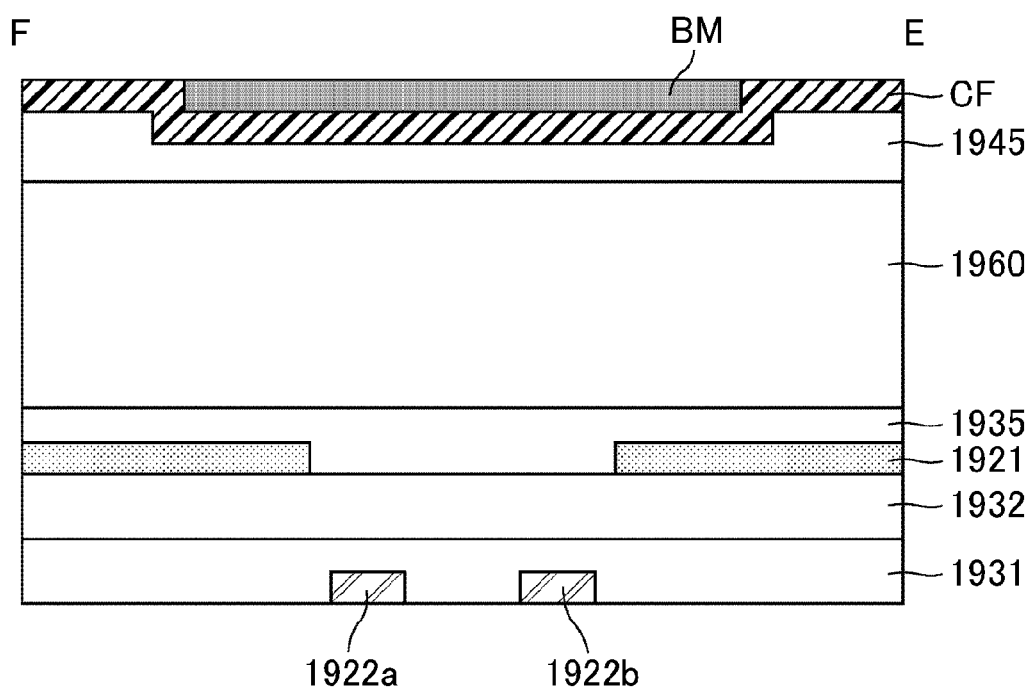
FIG. 27 is a schematic cross-sectional view showing the circuit substrate in FIG. 26 along a line E-F.

FIG. 26 is a schematic plan view of a Comparison Example 1 showing a structure of a pixel of a circuit substrate. FIG. 27 is a schematic cross-sectional view showing the circuit substrate in FIG. 26 cut along a line E-F. The circuit substrate in Comparison Example 1 does not have a patterned film between two adjacent gate wiring lines (signal lines) 1922a and 1922b and light-shielding cannot be sufficiently performed at the damaged part of the light-shielding member.

(Other Suitable Embodiments)

In the respective embodiments of the present invention, an oxide semiconductor TFT (IGZO, In—Ga—Zn—O semiconductor, is especially preferable) is preferably used. The effect of combining an oxide semiconductor TFT and a dual-gate structure is described in detail below.

(1) An oxide semiconductor TFT has a higher ON current than an a-Si (amorphous silicon) TFT. Thus, even if the number of gate wiring lines doubles due to the dual-gate structure, higher resolution can be achieved.

(2) An oxide semiconductor TFT has a higher ON current than an a-Si TFT, and the OFF current thereof is lower. Thus, even if the number of gate wiring lines double due to a dual gate structure, a down period (stop driving after one frame ends) for driving can be set, and lower power consumption can be achieved.

If a touch panel sensing period occurs during the down period, noise in the touch panel decreases, or in other words, the accuracy of the touch panel improves.

Figure 21:
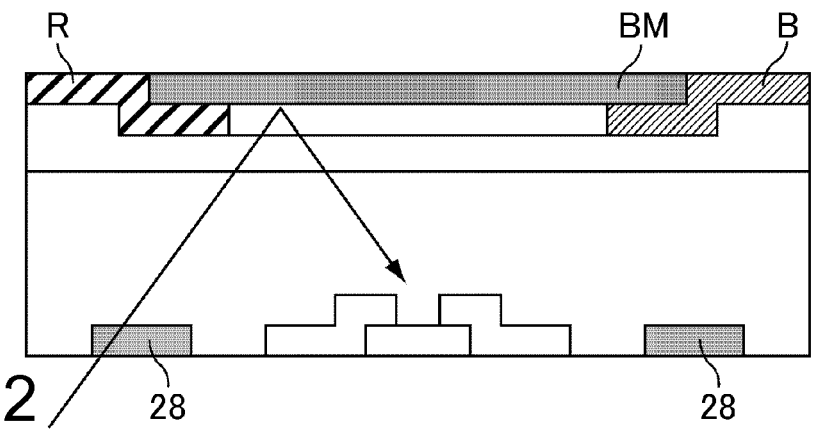
FIG. 21 is a schematic cross-sectional view of a liquid crystal display device showing light from a black light being reflected by a black matrix and then entering a metal channel.

It is preferable that a patterned film is disposed near the TFT as in Working Example 1-1. As a result, the OFF leakage of a TFT can be sufficiently prevented (for example, as shown in FIG. 21, by providing a patterned film (light-shielding film) 28 on the bottom substrate, the light shown as an arrow can be blocked, and OFF leakage of the TFT can be prevented). A configuration that can be suitably applied to the respective embodiments above is mentioned below.

The tip of the projection of the patterned film may be completely separated from the pixel electrode or have a portion overlap, and is not limited in this sense.

The patterned film may perform cuts on unnecessary wiring lines in order to decrease capacitance or the like (cut is possible as a patterned film that overlaps a large area of the scan signal line is not provided).

Figure 24:
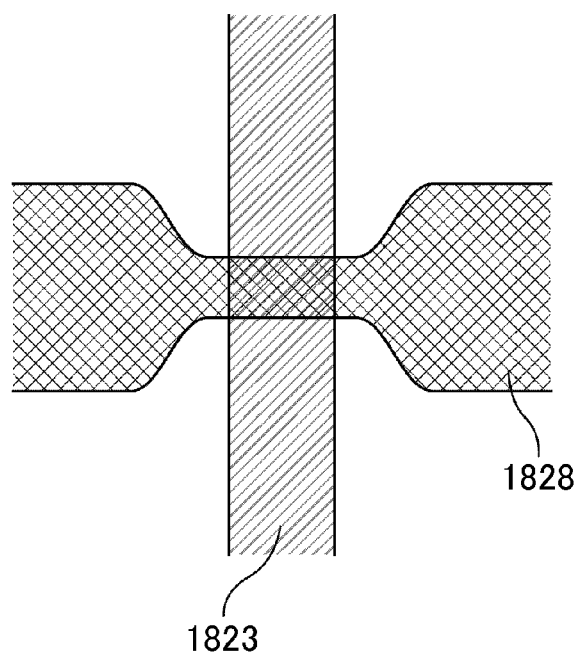
FIG. 24 is a schematic plan view showing a suitable form of intersection between a signal line and a patterned film.

Furthermore, it is preferable that a metal with high reflectance (aluminum, aluminum alloy, or the like, for example) be used in order to improve the efficiency of transmittance. The repair wiring line that crosses the signal line may be designed such that only the crossing portion is narrow and the capacitance of the panel be decreased (FIG. 24, for example).

In the respective embodiments above, configurations in which two gate signal lines are provided between pixels were shown, but as long as the effect of the present invention is preserved, another gate signal line may be provided. The wiring line that has the patterned film therebetween may be other wiring lines such as two adjacent data signal lines between pixels instead of two adjacent gate signal lines between pixels.

Instead of ITO, know materials such as IZO (indium zinc oxide) can be used as the electrode material.

The present invention can be applied to display devices other than liquid crystal display devices such as EL devices.

The respective configurations of the embodiments mentioned above may be appropriately combined within a scope that does not depart from the gist of the present invention.

DESCRIPTION OF REFERENCE CHARACTERS 21, 521, 621, 721, 1121, 1221, 1321, 1421, 1521, 1621, 1721, 1921: pixel electrode
22a, 22b, 522a, 522b, 622a, 622b, 722a, 722b, 1122a, 1122b, 1222a, 1222b, 1322a, 1322b, 1422a, 1422b, 1522a, 1522b, 1622a, 1622b, 1722a, 1722b, 1922a, 1922b gate signal line
23, 523, 623, 723, 1123, 1223, 1323, 1423, 1523, 1623, 1723, 1823, 1923 data signal line
24, 524, 624, 724, 1124, 1224, 1324, 1424, 1524, 1624, 1724, 1924 thin film transistor (TFT)
25, 525, 625, 725, 1125, 1225, 1325, 1425, 1525, 1625, 1725, 1925 drain lead-out wiring line
26, 526, 626, 726, 1126, 1226, 1326, 1426, 1526, 1626, 1726, 1926 contact hole
28, 128, 528, 628, 728, 828, 928, 1028, 1128, 1228, 1328, 1428, 1528, 1628, 1728, 1828 repair wiring line (patterned film)
31, 731, 1931 first insulating film
32, 732, 1932 second insulating film
35, 45, 735, 745, 1935, 1945 alignment film
529, 629 same transparent film as pixel electrode
51 area without colored layer
53 area where top and bottom color boundary forms at ease
60, 760, 1960 liquid crystal layer
733 third insulating film
1628, 1728, 1828 patterned film
1823 signal line
B blue colored layer
G green colored layer
R red colored layer
BM black matrix (outside bold line
CF color filter
Cs, CSS storage capacitance wiring line
CHpas hole formed in insulating film

What is claimed is:

1. A circuit substrate included in a display device that displays an image by using pixels, comprising:
    a substrate;
    a plurality of first wiring lines and a plurality of second wiring lines that intersect with the first wiring lines on the substrate;
    thin film transistor elements;
    a plurality of pixel electrodes on the substrate, the plurality of pixel electrodes being electrically connected to drain electrodes of the thin film transistor elements; and
    a patterned film on the substrate,
    wherein two of the first wiring lines extend alongside each other between two adjacent rows of pixels in a plan view, and said patterned film generally has a linear shape extending along and between said two of the first wiring lines extending alongside each other,
    wherein the patterned film is provided in the same layer as the second wiring lines.

2. The circuit substrate according to claim 1, further comprising:
    an insulating film,
    wherein either of the patterned film and at least one of said two of the first wiring lines has a plurality of projections in a widthwise direction of the patterned film projecting towards another of the pattern film and said at least one of the first wiring lines, so as to have overlapping portions that overlap, through the insulating film, said another of the pattern film and said at least one of the first wiring lines.

3. The circuit substrate according to claim 2,
    wherein the patterned film has the plurality of projections on both sides thereof in the widthwise direction of the patterned film, and
    wherein the plurality of projections have the overlapping portions that overlap both of the two of the first wiring lines through the insulating film.

4. The circuit substrate according to claim 2,
    wherein said two of the first wiring lines respectively have the plurality of projections on a side facing the patterned film, and
    wherein the plurality of projections of the first wiring lines have the overlapping portions that overlap the patterned film through the insulating film.

5. The circuit substrate according to claim 1,
    wherein either of the first wiring lines and the second wiring lines are gate wiring lines, and
    wherein another of the first wiring lines and the second wiring lines are source wiring lines.

6. The circuit substrate according to claim 2, further comprising:
    a storage capacitance wiring line on the substrate,
    wherein said storage capacitance wiring line overlaps the projections in a plan view.

7. The circuit substrate according to claim 1, wherein the patterned film is formed of a material including at least one element selected from a group including Al, Cr, Ta, Ti, W, Mo, and Cu.

8. The circuit substrate according to claim 1, wherein the thin film transistors include an oxide semiconductor.

9. A display device, comprising the circuit substrate according to claim 1.

10. The circuit substrate according to claim 3, further comprising:
    a storage capacitance wiring line on the substrate,
    wherein said storage capacitance wiring line overlaps the projections in a plan view.

11. The circuit substrate according to claim 8, wherein the oxide semiconductor is an In—Ga—Zn—O semiconductor.

* * * * *